United States Patent
Sampica et al.

(10) Patent No.: US 8,540,002 B2
(45) Date of Patent: Sep. 24, 2013

(54) SYSTEM AND METHOD FOR COMPLETING LAMINATION OF RIGID-TO-RIGID SUBSTRATES BY THE CONTROLLED APPLICATION OF PRESSURE

(75) Inventors: James D. Sampica, Springville, IA (US); Paul R. Nemeth, Cedar Rapids, IA (US); Tracy J. Barnidge, Marion, IA (US); Vincent P. Marzen, Robins, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/420,381

(22) Filed: Mar. 14, 2012

(65) Prior Publication Data

US 2012/0168086 A1    Jul. 5, 2012

Related U.S. Application Data

(60) Division of application No. 12/009,393, filed on Jan. 18, 2008, now Pat. No. 8,137,498, which is a continuation-in-part of application No. 11/215,683, filed on Aug. 30, 2005, now Pat. No. 7,435,311, and a continuation-in-part of application No. 11/214,518, filed on Aug. 30, 2005, now Pat. No. 7,566,254.

(51) Int. Cl.
*B32B 37/00* (2006.01)

(52) U.S. Cl.
USPC .......................................... 156/381; 156/382

(58) Field of Classification Search
USPC .................................. 156/381, 382
See application file for complete search history.

(56) References Cited

U.S. PATENT DOCUMENTS

| | | | |
|---|---|---|---|
| 3,089,801 | A | 5/1963 | Tierney et al. |
| 3,616,197 | A | 10/1971 | Amberg et al. |

(Continued)

FOREIGN PATENT DOCUMENTS

| | | |
|---|---|---|
| EP | 0 556 351 B1 | 6/1995 |
| EP | 0711103 | 5/1996 |

(Continued)

OTHER PUBLICATIONS

Office Action for U.S. Appl. No. 12/009,482, mail date Feb. 21, 2012, 20 pages.

(Continued)

*Primary Examiner* — Jeff Aftergut
(74) *Attorney, Agent, or Firm* — Donna P. Suchy; Daniel M. Barbieri

(57) ABSTRACT

The present invention is a process for performing rigid-to-rigid substrate lamination implementing pressure-sensitive adhesive (PSA). The process may include pressurizing a first sealed cavity to a first pressure. The process may further include creating a vacuum within a second sealed cavity, the second sealed cavity being sealed from the first sealed cavity by a flexible membrane. The process may further include applying the first pressure to a laminate assembly stack via the flexible membrane, the laminate assembly stack including a first substrate, a second substrate, and a PSA layer, the PSA layer being positioned between the first substrate and the second substrate. The process may further include applying the vacuum created within the second sealed cavity to the laminate assembly stack. The applied first pressure and the applied vacuum promote intimate contact between the first substrate and the second substrate of the laminate assembly stack via the PSA layer.

11 Claims, 12 Drawing Sheets

(56) References Cited

U.S. PATENT DOCUMENTS

| | | |
|---|---|---|
| 3,851,758 A | 12/1974 | Makhijani et al. |
| 4,078,962 A | 3/1978 | Krueger |
| 4,188,254 A | 2/1980 | Hemperly, Jr. |
| 4,235,951 A | 11/1980 | Swarovski |
| 4,737,182 A | 4/1988 | Fecik et al. |
| 4,747,577 A | 5/1988 | Dimock |
| 4,756,735 A | 7/1988 | Cathers et al. |
| 5,108,532 A * | 4/1992 | Thein et al. ............ 156/285 |
| 5,566,840 A | 10/1996 | Waldner et al. |
| 5,592,288 A | 1/1997 | Sampica et al. |
| 5,678,303 A | 10/1997 | Wichmann |
| 5,918,517 A | 7/1999 | Malapert et al. |
| 5,950,512 A | 9/1999 | Fields |
| 5,959,762 A | 9/1999 | Bandettini et al. |
| 6,128,066 A | 10/2000 | Yokozeki |
| 6,366,013 B1 | 4/2002 | Leenders et al. |
| 6,388,724 B1 | 5/2002 | Campbell et al. |
| 6,481,482 B1 | 11/2002 | Shimotomai |
| 6,614,057 B2 | 9/2003 | Silvernail et al. |
| 6,681,668 B1 | 1/2004 | Smirle |
| 6,803,245 B2 | 10/2004 | Auch et al. |
| 6,832,538 B1 | 12/2004 | Hwang |
| 6,842,288 B1 | 1/2005 | Liu et al. |
| 6,984,545 B2 | 1/2006 | Grigg et al. |
| 6,998,648 B2 | 2/2006 | Silvernail |
| 7,273,403 B2 | 9/2007 | Yokota et al. |
| 7,349,154 B2 | 3/2008 | Aiura et al. |
| 7,381,110 B1 | 6/2008 | Sampica et al. |
| 7,435,311 B1 | 10/2008 | Marzen et al. |
| 7,452,258 B1 | 11/2008 | Marzen et al. |
| 7,566,254 B2 | 7/2009 | Sampica et al. |
| 7,814,676 B2 | 10/2010 | Sampica et al. |
| 7,927,440 B2 | 4/2011 | Matsuhira |
| 7,929,086 B2 | 4/2011 | Toyama et al. |
| 8,038,498 B2 | 10/2011 | Miyauchi et al. |
| 8,118,075 B2 | 2/2012 | Sampica et al. |
| 8,137,498 B2 | 3/2012 | Sampica et al. |
| 2001/0053648 A1 | 12/2001 | Furukawa et al. |
| 2002/0186343 A1 | 12/2002 | Liao et al. |
| 2003/0043315 A1 | 3/2003 | Umemoto et al. |
| 2003/0089214 A1 | 5/2003 | Fukuta et al. |
| 2003/0156238 A1 | 8/2003 | Hiraishi et al. |
| 2003/0174396 A1 | 9/2003 | Murayama et al. |
| 2003/0180528 A1 | 9/2003 | Flosenzier et al. |
| 2003/0189606 A1 | 10/2003 | Moon et al. |
| 2004/0066645 A1 | 4/2004 | Graf et al. |
| 2005/0126679 A1 | 6/2005 | Kim |
| 2005/0249946 A1 | 11/2005 | Hsu et al. |
| 2006/0035060 A1 | 2/2006 | Koyama et al. |
| 2006/0098452 A1 | 5/2006 | Choi et al. |
| 2006/0215265 A1 | 9/2006 | Miyatake et al. |
| 2006/0245171 A1 | 11/2006 | Kim et al. |
| 2006/0290253 A1 | 12/2006 | Yeo et al. |
| 2007/0031997 A1 | 2/2007 | Lee et al. |
| 2007/0228586 A1 | 10/2007 | Merrill et al. |
| 2007/0297736 A1 | 12/2007 | Sherman et al. |
| 2008/0305721 A1 | 12/2008 | Ohashi et al. |
| 2009/0040772 A1 | 2/2009 | Laney |
| 2009/0046229 A1 | 2/2009 | Umemoto et al. |
| 2009/0120572 A1 | 5/2009 | Sampica et al. |
| 2009/0120585 A1 | 5/2009 | Sampica et al. |
| 2009/0126872 A1 | 5/2009 | Sampica et al. |
| 2009/0153783 A1 | 6/2009 | Umemoto |
| 2009/0183381 A1 | 7/2009 | Sampica et al. |
| 2009/0183615 A1 | 7/2009 | Sampica et al. |
| 2009/0186218 A1 | 7/2009 | Sampica et al. |
| 2009/0279030 A1 | 11/2009 | Toyama et al. |
| 2009/0279175 A1 | 11/2009 | Laney et al. |
| 2010/0103353 A1 | 4/2010 | Yamada |
| 2010/0297406 A1 | 11/2010 | Schaffer et al. |
| 2011/0075070 A1 | 3/2011 | Kitagawa et al. |
| 2011/0141405 A1 | 6/2011 | Kitagawa et al. |
| 2011/0165361 A1 | 7/2011 | Sherman et al. |

FOREIGN PATENT DOCUMENTS

| | | |
|---|---|---|
| EP | 0 962 752 A1 | 12/1999 |
| EP | 0711103 B1 * | 8/2000 |
| JP | 01 210328 A | 8/1989 |
| JP | 05-200880 A | 8/1993 |
| JP | 05-293895 A | 11/1993 |
| JP | 06-051484 A | 2/1994 |
| JP | 09-057779 A | 3/1997 |
| JP | 10 156853 A | 6/1998 |
| JP | 10 244589 A | 9/1998 |
| JP | 2000 141388 A | 5/2000 |
| JP | 2001-005401 A | 1/2001 |
| JP | 2001-166272 | 6/2001 |
| JP | 2002-137352 | 5/2002 |
| JP | 2002-313688 | 10/2002 |
| JP | 2004-58349 A * | 2/2004 |
| JP | 2004 233590 A | 8/2004 |
| JP | 2006 218658 A | 8/2006 |
| JP | 2006-222267 | 8/2006 |
| JP | 2006 334912 A | 12/2006 |
| JP | 2007 206559 A | 8/2007 |
| JP | 2008 238607 A | 1/2008 |
| KR | 10-1999-0029922 | 4/1999 |
| KR | 10-2007-0016614 | 2/2007 |
| WO | WO 93/05634 | 3/1993 |
| WO | WO 2004/046230 | 6/2004 |
| WO | WO 2005/098522 | 10/2005 |
| WO | WO 2007/063818 | 6/2007 |

OTHER PUBLICATIONS

U.S. Appl. No. 12/009,472, filed Jan. 18, 2008, Sampica et al.
U.S. Appl. No. 12/009,482, filed Jan. 18, 2008, Sampica et al.
U.S. Appl. No. 12/786,169, filed May 24, 2010, Nemeth et al.
Kipp, D.O. (2004;2010). Plastic Material Data Sheets. MatWeb—Division of Automation Creation, Inc., Online version available at: http://www.knovel.com/web/portal/browse/display?_EXT_KNOVEL_DISPLAY_bookid=1023&VerticalID=0., 6 pages.
Walker, Geoff, GD-Itronix Dynavue Technology, The Ultimate Outdoor-Readable Touch-Screen Display, Rugged PC Review, pp. 1-4, United States of America.
Office Action for U.S. Appl. No. 12/786,169, mail date Jul. 20, 2012, 8 pages.
Office Action for U.S. Appl. No. 12/009,472, mail date Nov. 9, 2012, 15 pages.
Office Action for U.S. Appl. No. 12/009,482, mail date Nov. 21, 2012, 20 pages.
Office Action for U.S. Appl. No. 12/009,372, mail date Dec. 20, 2010, 10 pages.
Office Action for U.S. Appl. No. 12/009,372, mail date Jun. 13, 2011, 9 pages.
Notice of Allowance for U.S. Appl. No. 12/009,372, mail date Oct. 13, 2011, 8 pages.
Office Action for U.S. Appl. No. 12/009,373, mail date Dec. 30, 2009, 14 pages.
Notice of Allowance for U.S. Appl. No. 12/009,373, mail date Jun. 16, 2010, 4 pages.
Office Action for U.S. Appl. No. 12/009,375, mail date Mar. 28, 2011, 9 pages.
Office Action for U.S. Appl. No. 12/009,375, mail date Jul. 22, 2011, 8 pages.
Office Action for U.S. Appl. No. 12/009,393, mail date Jul. 20, 2011, 8 pages.
Notice of Allowance for U.S. Appl. No. 12/009,393, mail date Nov. 14, 2011, 7 pages.
Office Action for U.S. Appl. No. 12/009,472 mail date Jan. 14, 2011, 14 pages.
Office Action for U.S. Appl. No. 12/009,472, mail date Nov. 3, 2011, 15 pages.
Office Action for U.S. Appl. No. 12/009,482, mail date Aug. 16, 2011, 16 pages.
Office Action for U.S. Appl. No. 13/538,957, mail date Oct. 5, 2012, 18 pages.
Advisory Action for U.S. Appl. No. 12/009,472, mail date Feb. 25, 2013, 3 pages.

Office Action for U.S. Appl. No. 12/009,472, mail date Mar. 20, 2013, 15 pages.
Office Action for U.S. Appl. No. 12/786,169, mail date Jan. 18, 2013, 14 pages.
Notice of Allowance for U.S. Appl. No. 12/786,169, mail date Mar. 28, 2013, 6 pages.
Office Action for U.S. Appl. No. 13/538,957, mail date Apr. 4, 2013, 19 pages.
International Search Report for Application No. PCT/US2009/031151, mail date Aug. 28, 2009, 3 pages.

* cited by examiner

SYSTEM AND METHOD FOR COMPLETING LAMINATION OF RIGID-TO-RIGID SUBSTRATES BY THE CONTROLLED APPLICATION OF PRESSURE

CROSS-REFERENCE TO RELATED PATENT APPLICATIONS

The present application is a divisional application of U.S. application Ser. No. 12/009,393, filed Jan. 18, 2008, now U.S. Pat. No. 8,137,498, which is a continuation-in-part of U.S. application Ser. No. 11/214,518, filed Aug. 30, 2005, now U.S. Pat. No. 7,566,254, and a continuation-in-part of U.S. application Ser. No. 11/215,683, filed Aug. 30, 2005, now U.S. Pat. No. 7,435,311. All of these applications are incorporated herein by reference in their entireties.

The present application incorporates by reference in their entireties each of the following applications: U.S. application Ser. No. 12/009,375, filed Jan. 18, 2008, entitled: "Substrate Lamination System and Method" filed Jan. 18, 2008 and having Express Mail Mailing Label Number EM 117518596 US; U.S. application Ser. No. 12/009,482, filed Jan. 18, 2008, entitled: "Substrate Lamination System and Method" filed Jan. 18, 2008 and having Express Mail Mailing Label Number EM 117518605 US; U.S. application Ser. No. 12/009,372, filed Jan. 18, 2008, entitled: "System and Method for Disassembling Laminated Substrates" filed Jan. 18, 2008 and having Express Mail Mailing Label Number EM 117518675 US; U.S. application Ser. No. 12/009,373, filed Jan. 18, 2008, entitled: "Alignment System and Method Thereof" filed Jan. 18, 2008 and having Express Mail Mailing Label Number EM 117518667 US; and U.S. application Ser. No. 12/009,472, filed Jan. 18, 2008, entitled: "Planarization Treatment of Pressure Sensitive Adhesive for Rigid-to-Rigid Substrate Lamination" filed Jan. 18, 2008 and having Express Mail Mailing Label Number EM 117518653 US.

FIELD OF THE INVENTION

The present invention relates to the field of lamination processes and particularly to a system and method for completing lamination of rigid-to-rigid substrates by the controlled application of pressure.

BACKGROUND

Currently existing lamination processes, such as manual, liquid lamination processes, may be used for rigid-to-rigid substrate lamination. However, such processes may be time-consuming, inefficient, expensive and/or capital intensive. Alternatively, other currently existing lamination processes, such as dry-film lamination processes, may not be suitable for use in rigid-to-rigid substrate lamination because said dry-film lamination processes may produce laminated assemblies in which voids or bubbles (due to gas entrapment occurring during the lamination process) are present therein. For example, if the laminated assembly is a display assembly, said voids or bubbles may cause the appearance of undesirable optical effects or visual anomalies, such as visible blotches in the display. Further, said dry-film lamination processes may result in/may produce one or more of the following: substrate breakage; laminated assemblies having poor performance; and/or laminated assemblies having poor repairability. The above-referenced shortcomings of the dry-film lamination processes may be due at least in part to lack of intimate substrate contact via the adhesive material during lamination.

Thus, it would be desirable to provide a system and method for performing rigid-to-rigid substrate lamination which obviates the problems associated with current solutions.

SUMMARY

Accordingly, an embodiment of the present invention is directed to a system/apparatus for performing rigid-to-rigid substrate lamination processes implementing pressure-sensitive adhesive (PSA), including: a base portion, the base portion being configured with a support surface for supporting at least one laminate assembly stack, each laminate assembly stack included in the at least one laminate assembly stack including at least one layer of PSA, a first substrate, and a second substrate, the at least one layer of PSA being positioned between the first substrate and the second substrate, the base portion being further configured with a vacuum port for allowing the base portion to be connected with a vacuum pump; a cover portion configured for being connected with the base portion, the cover portion further configured for forming an enclosure with the base portion when the apparatus is established in a closed position, the cover portion being configured with at least one pressurization port for allowing the cover portion to be connected with at least one pressurization source; and at least one flexible membrane configured for being at least one of connected to the cover portion, connected to the base portion, or positioned between the cover portion and the base portion, the at least one flexible membrane and the cover portion forming a first sealed cavity when the apparatus is established in the closed position, the at least one flexible membrane and base portion forming a second sealed cavity when the apparatus is established in the closed position, when a pressure is created within the first sealed cavity via the pressurization port and when a vacuum is created within the second sealed cavity via the vacuum port, the at least one flexible membrane further configured for applying said pressure to the at least one laminate assembly stack while said vacuum is applied to the at least one laminate assembly stack, wherein at least one of a magnitude, duration or location of the applied pressure is selectably controllable, the applied pressure and applied vacuum promoting intimate contact between the first substrate and the second substrate via the PSA layer(s) for the at least one laminate assembly stack during rigid-to-rigid substrate lamination processes.

A further embodiment of the present invention is directed to a process for performing rigid-to-rigid substrate lamination implementing pressure-sensitive adhesive (PSA), including: pressurizing a first sealed cavity to a first pressure; creating a vacuum within a second sealed cavity, the second sealed cavity being sealed from the first sealed cavity by a flexible membrane; applying the first pressure to a laminate assembly stack via the flexible membrane, the laminate assembly stack including a first substrate, a second substrate, and a PSA layer, the PSA layer being positioned between the first substrate and the second substrate; and applying the vacuum created within the second sealed cavity to the laminate assembly stack, wherein the applied first pressure and the applied vacuum promote intimate contact between the first substrate and the second substrate of the laminate assembly stack via the PSA layer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF EXEMPLARY EMBODIMENTS

Reference will now be made in detail to the presently preferred embodiments of the invention, examples of which are illustrated in the accompanying drawings.

Referring generally to FIGS. 1-13, various embodiments of an apparatus for performing rigid-to-rigid substrate lamination processes implementing pressure-sensitive adhesive (PSA) are shown in accordance with the present invention. For example, the apparatus may be a lamination tool, such as for laminating display assemblies. Further, PSA may encompass commercially available PSA (ex—dry film pressure-sensitive adhesive, acrylic lamination material), which has undergone planarization treatment as described in United States patent application entitled: "Planarization Treatment of Pressure Sensitive Adhesive for Rigid-to-Rigid Substrate Lamination" filed Jan. 18, 2008 and having Express Mail Mailing Label Number EM 117518653 US which is incorporated by reference in its entirety herein. In exemplary embodiments of the present invention, rigid-to-rigid lamination processes may encompass processes as shown and described in the United States patent application entitled: "Substrate Lamination System and Method" filed Jan. 18, 2008 and having Express Mail Mailing Label Number EM 117518596 US; and the United States patent application entitled: "Substrate Lamination System and Method" filed Jan. 18, 2008 and having Express Mail Mailing Label Number EM 117518605 US (both of which are incorporated by reference in their entireties herein), in which rigid substrates are joined/secured together via the PSA, said substrates may be display assembly components, such as optical or non-optical substrates, or sheet-like assemblies (ex—Liquid Crystal Displays (LCDs)/LCD modules, Organic Light-Emitting Diodes (OLEDs), Circuit Boards, Heat Sinks, cover glass for LCD modules, etc.). The rigid-to-rigid lamination processes of the present invention involve applying pressure to the substrates in a controlled or selective manner so as to promote minimization of gas entrapment/air bubbles between substrates during assembly/lamination, thereby promoting reduced occurrences of the appearance of undesirable optical effects or visual anomalies in the laminated assembly (ex—blotches or voids on a display).

Figure 1:
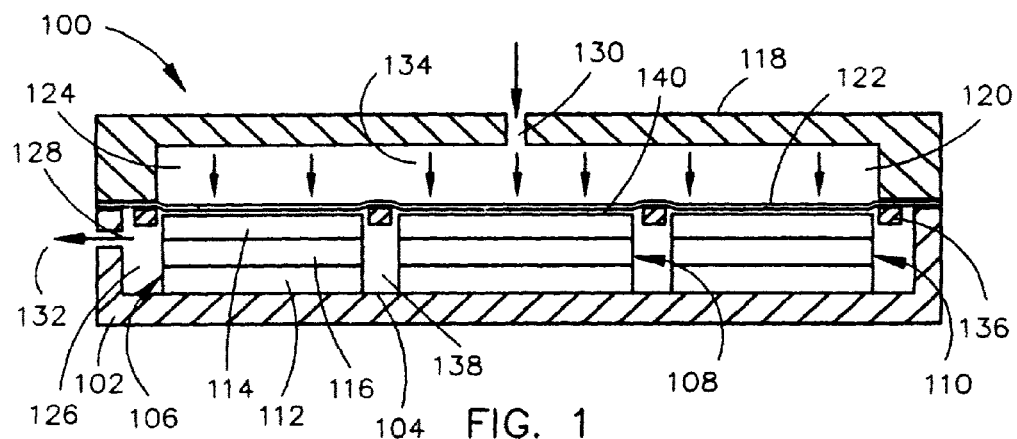
FIG. 1 is a cross-sectional view of an apparatus/system for performing rigid-to-rigid substrate lamination processes implementing pressure-sensitive adhesive (PSA), said apparatus implementing a single flexible membrane applying pressure to multiple, discreet laminate assembly stacks in accordance with an exemplary embodiment of the invention.
Figure 2:
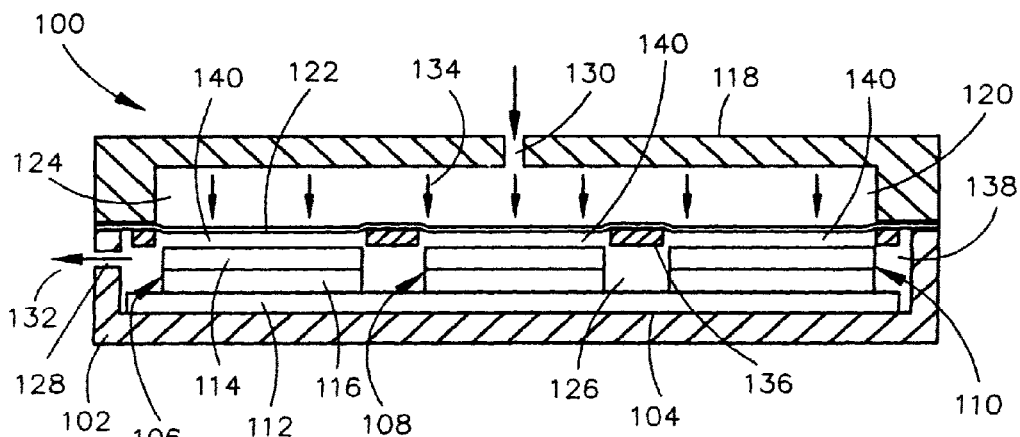
FIG. 2 is a cross-sectional view of the apparatus shown in FIG. 1, said apparatus implementing a single flexible membrane applying pressure to multiple laminate assembly stacks, said multiple laminate assembly stacks having a common/shared substrate in accordance with an exemplary embodiment of the invention.

Referring generally to FIGS. 1 and 2, an apparatus 100 for performing rigid-to-rigid substrate lamination processes implementing pressure-sensitive adhesive (PSA) is shown. The apparatus 100 may include a base portion 102. For instance, the base portion 102 may be a rectilinearly-shaped, tray-like device. Further, the base portion 102 may include a support surface 104 configured for supporting one or more laminate assembly stacks 106, 108, 110. In exemplary embodiments, each laminate assembly stack (106, 108, 110) may include a first substrate 112 (which may be positioned directly on/in direct physical contact with the support surface 104), a second substrate 114, and one or more PSA layers 116 positioned or "sandwiched" between the first substrate 112 and the second substrate 114. For example, the first substrate 112 may be a cover glass layer for an LCD module, while the second substrate 114 may be an LCD module. Further, the one or more PSA layers 116 may be pre-adhered to the first substrate 112 and/or second substrate 114 prior to lamination (ex—prior to placement on the support surface 104). As shown in FIG. 2, one or more substrates and/or layers, such as the first substrate 112 of each laminate assembly stack (106, 108, 110) may be shared between/may be common to each of the stacks. For example, the first substrate 112 may be a single sheet of cover glass having multiple second substrates 114 (ex—LCD modules) and multiple PSA layers 116 stacked upon it so that multiple LCD modules may be laminated to the single sheet of cover glass.

In an exemplary embodiment, the apparatus 100 may include a cover portion 118. Further, the cover portion 118 may be connected to/configured for being connected with the base portion 102. For instance, the cover portion 118 may be attached to base portion 102 in a clamshell-style configuration. In further embodiments, the cover portion 118 is configured for forming an enclosure 120 with the base portion 102 when the apparatus 100 is established in a closed position (ex—if the assembly 100 is a clamshell-style configuration, the closed position (shown in FIGS. 1, 2) is when the cover portion 118 is "flipped down" onto/over the base portion 102 and/or secured against the base portion, thereby closing or sealing the enclosure 120).

In current embodiments of the present invention, the apparatus 100 may include a flexible membrane 122. The flexible membrane 122 may be configured for being: a.) connected to the cover portion 118, b.) connected to the base portion 102 and/or c.) positioned (ex—"sandwiched") between the base portion 102 and the cover portion 118. In further embodiments, the flexible membrane 122 may be connected/positioned in such a manner that the flexible membrane 122 and the cover portion 118 form a first sealed cavity 124 when the apparatus 100 is established in the closed position. In additional embodiments, the flexible membrane 122 may be connected/positioned in such a manner that the flexible membrane 122 and the base portion 102 form a second sealed cavity 126 when the apparatus 100 is established in the closed position.

In an exemplary embodiment, the base portion 102 may be configured with a vacuum port 128 for allowing the base portion 102 of the apparatus 100 to be connected with a vacuum pump. In further embodiments, the cover portion 118 may be configured with a pressurization port 130 for allowing the cover portion 118 of the apparatus 100 to be connected with a pressurization source. In additional embodiments, when the vacuum port 128 is connected with the vacuum pump, a vacuum 132 may be created within the second sealed cavity 126, thereby subjecting the laminate assembly stacks (106, 108, 110) to vacuum/vacuum pressure. In still further embodiments, when the pressurization port 130 is connected with the pressurization source, a pressure 134 may be created within the first sealed cavity 124. In additional embodiments, the pressure 134 created within the first sealed cavity 124 exerts against the flexible membrane 122 (ex—creates a backpressure on the flexible membrane 122), thereby causing the flexible membrane 122 to apply the created pressure to the laminate assembly stack(s) (106, 108, 110) by expanding against the second substrate(s) 114 of the laminate assembly stacks, said laminate assembly stacks being supported on the support surface 104 of the base portion 102. In exemplary embodiments, the flexible membrane 122 may be formed of an elastic material, such as silicone. Still further, the material forming the flexible membrane 122 may be chosen based on properties such as electrostatic discharge (ESD) properties, tear strength, elongational properties, or the like. Further, the flexible membrane 122 may be coated with one or more layers of plastic (ex—polyethylene) or other like material, the surface of which won't hold an electric-charge (ex—an electric charge won't be created on its surface) when said material is peeled/pulled away/removed from another material/surface.

In current embodiments of the present invention, the laminate assembly stacks (106, 108, 110) may be concurrently subjected to the created pressure within the first sealed cavity/flexible membrane-applied pressure 134 and the vacuum 132 created within the second sealed cavity 126. By concurrently subjecting the laminate assembly stacks (106, 108, 110) to the flexible membrane-applied pressure 134 and the vacuum 132, intimate substrate (112, 114) contact via the PSA 116 may be promoted, such that entrapment of air/gas bubbles between the substrates (112, 114) is reduced or minimized, thereby reducing the likelihood that voids, optical anomalies/non-uniformities, or the like will appear in laminated display assemblies produced via rigid-to-rigid lamination processes implementing the apparatus 100 of the present invention.

In exemplary embodiments, the apparatus 100 may include a protective carriage, mask, or insert 136. The protective carriage 136 may be configured for being removably placed upon the support surface 104. For instance, the protective carriage 136 may be a rectilinearly-shaped lid or cover-like structure which may be seated within or on a correspondingly-shaped/sized tray-like or pan-like base portion 102 and upon the support surface 104. In further embodiments, when the protective carriage 136 is seated upon the support surface 104, the protective carriage 136 and the support surface 104 form a partial enclosure 138. The protective carriage 136 may function to protect sensitive components of the substrate(s) (112, 114), such as boards and flex circuits of an LCD module, from being subjected to physical contact with and/or pressure applied by the flexible membrane 122.

In further embodiments, a surface of the carriage 136 may form one or more apertures 140/may have one or more apertures 140 formed therethough. Further, the apertures 140 may be shaped/sized for allowing physical access to the laminate assembly stacks (106, 108, 110) positioned on the support surface 104. As previously discussed, when the carriage 136 of the present invention is seated upon the support surface 104 and within the base portion 102, the support surface 104 and the carriage 136 form a partial enclosure 138. Still further, the apertures 140 formed by the carriage 136 may allow physical access to the laminate assembly stacks (106, 108, 110) (ex— access to the second/top substrates 114 of the stacks) when the laminate assembly stacks are positioned on the support surface 104. For instance, the apertures 140 may be formed such that when the carriage 136 is positioned on the support surface 104 and within or on the base portion 102, said apertures 140 may be aligned, shaped and sized so as to promote ease of physical access to laminate assembly stacks (106, 108, 110) positioned on the support surface 104. For example, the pressure 134 (ex—positive pressure) created within the first sealed cavity 124 may cause the flexible membrane 122 to expand and be directed through/via the apertures 140 of the carriage 136 and against the second substrates 114 (ex—LCD module(s)) of the laminate assembly stacks (106, 108, 110), thereby squeezing the laminate assembly stacks between the flexible membrane 122 and the support surface 104 and causing intimate contact between the substrates 112, 114 via the PSA 116. Further, the number of apertures 140 of the carriage 136 may be equivalent to the number of laminate assembly stacks (106, 108, 110) positioned on the support surface 104.

In exemplary embodiments, the pressure 134 applied by the flexible membrane 122 may be selectably controlled, such that the magnitude of said pressure 134 may be ramped or varied over time, and/or held at a uniform level for a duration of time for promoting intimate contact (ex—minimized air/gas entrapment) between the substrates (112, 114) via the PSA 116. In further embodiments, the pressure 134 applied by the flexible membrane may be selectably controlled to be applied for a selected or desired duration of time for promoting intimate contact between the substrates (112, 114).

Figure 3:
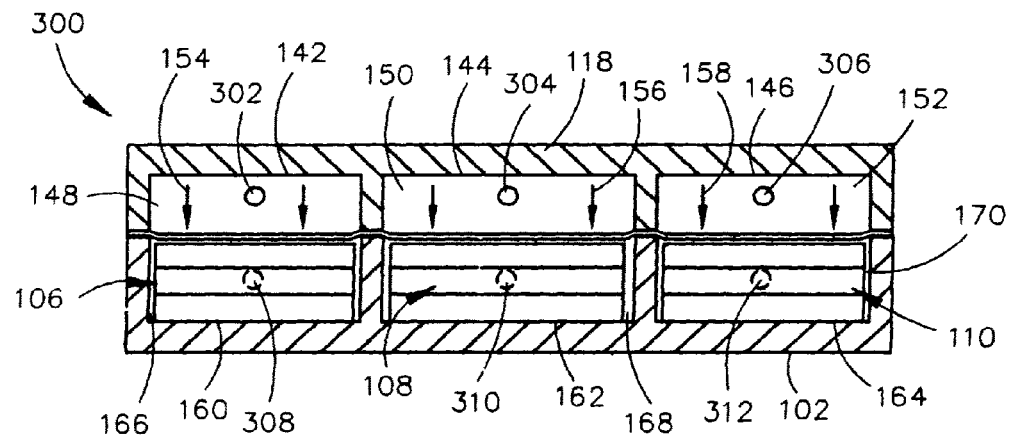
FIG. 3 is a cross-sectional view of an apparatus for performing rigid-to-rigid substrate lamination processes implementing pressure-sensitive adhesive (PSA), said apparatus having a plurality of sealed sub-cavities/pressure zones and a plurality of base receptacles in accordance with an alternative exemplary embodiment of the present invention.

FIG. 3 illustrates an alternative embodiment of an apparatus for performing rigid-to-rigid substrate lamination processes implementing pressure-sensitive adhesive (PSA). In the illustrated embodiment, the cover portion 118 of the apparatus 300 may form a plurality of cover partitions 142, 144, 146. For example, a first cover partition 142 may be configured for forming a first sealed sub-cavity 148 with the flexible membrane 122 when the apparatus 300 is established in the closed position. Further, a second cover partition 144 may be configured for forming a second sealed sub-cavity 150 with the flexible membrane 122 when the apparatus 300 is established in the closed position. Still further, a third cover partition 146 may be configured for forming a third sealed sub-cavity 152 with the flexible membrane 122 when the apparatus 300 is established in the closed position. Further, the apparatus 300 may include multiple pressurization ports (302, 304, 306) for allowing the cover portion 118 to be connected with multiple corresponding pressurization sources. In current embodiments of the present invention, a first pressurization port 302 may be connected to a first pressurization source for pressurizing the first sealed sub-cavity 148 to a first pressure 154, a second pressurization port 304 is connected to a second pressurization source for pressurizing the second sealed sub-cavity 150 to a second pressure 156, and a third pressurization port 306 is connected to a third pressurization source for pressurizing the third sealed sub-cavity 152 to a third pressure 158.

The apparatus 300 of FIG. 3 does not implement a carriage 136, but rather, the support surface 104 of the apparatus 300 is formed/contoured to include a plurality of base receptacles (160, 162, 164). The laminate assembly stacks (106, 108, 110) may be placed in the base receptacles (160, 162, 164) and/on the support surface 104. Each of the receptacles (160, 162, 164) is configured for forming a sealed base sub-cavity with the flexible membrane 122 when the apparatus 300 is established in the closed position. For example, a first receptacle 160 may form a first sealed base sub-cavity 166 with the flexible membrane 122, a second receptacle 162, may form a second sealed base sub-cavity 168 with the flexible membrane 122 and a third receptacle 164 may form a third sealed base sub-cavity 170 with the flexible membrane 122. Further, each base receptacle (160, 162, 164) may be configured so that the flexible membrane 122 may expand into each of the sealed base sub-cavities (166, 168, 170) to apply pressure to/contact the laminate assembly stack(s) (106, 108, 110).

In further embodiments, the base portion 102 of the apparatus 300 includes a plurality of vacuum ports (308, 310, 312) which may be connected to a plurality of corresponding vacuum pumps for creating a vacuum within each of the sealed base sub-cavities (166, 168, 170). The flexible membrane 122 may exert the first pressure 154 upon the first laminate assembly stack 106, the flexible membrane 122 may exert the second pressure 156 upon the second laminate assembly stack 108, and the flexible membrane 122 may exert the third pressure 158 upon the third laminate assembly stack 110. The first, second, and third pressures (154, 156, 158) may differ in magnitude from one another and may be selectably established/chosen based upon substrate (112, 114) characteristics, such as thickness, etc., for promoting intimate contact between the substrates (112, 114).

Figure 4:
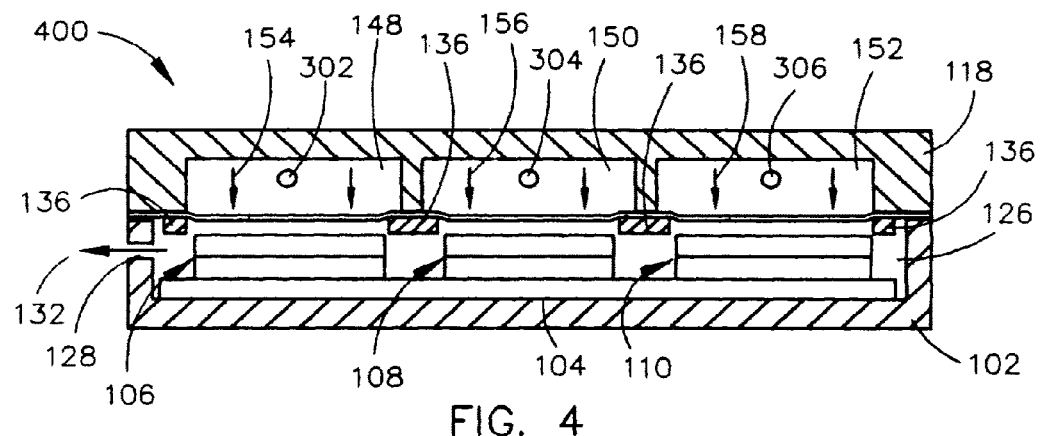
FIG. 4 is a cross-sectional view of an apparatus for performing rigid-to-rigid substrate lamination processes implementing pressure-sensitive adhesive (PSA), said apparatus having a plurality of sealed sub-cavities/pressure zones, said apparatus applying pressure(s) created within said sub-cavities/pressure zones to a plurality of laminate assembly stacks positioned within a sealed cavity formed by the base and the flexible membrane in accordance with an exemplary embodiment of the present invention.
Figure 5:
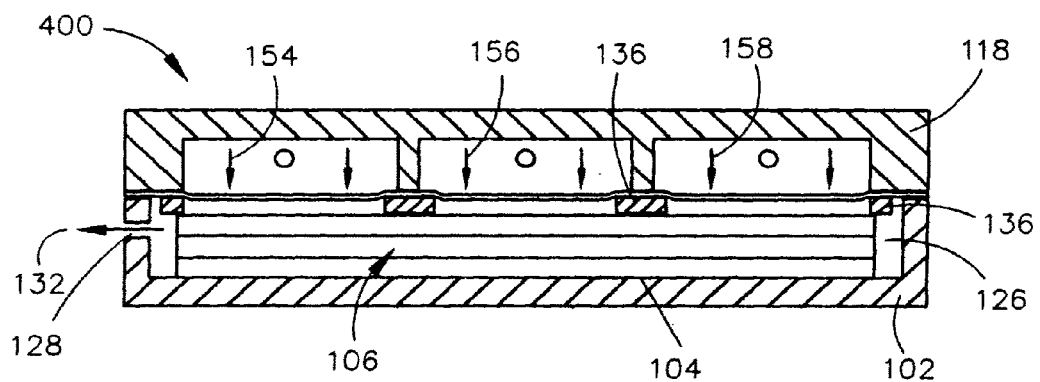
FIG. 5 is a cross-sectional view of the apparatus shown in FIG. 4, said view depicting application of pressure to a single laminate assembly stack in accordance with an exemplary embodiment of the present invention.

FIGS. 4 and 5 illustrate a further alternative embodiment of an apparatus for performing rigid-to-rigid substrate lamination processes implementing pressure-sensitive adhesive (PSA). The apparatus 400 allows for a first pressure 154 created within the first sealed sub-cavity 148 to be applied via the flexible membrane 122 to the first laminate assembly stack 106, a second pressure 156 created within the second sealed sub-cavity 150 to be applied via the flexible membrane 122 to the second laminate assembly stack 108, and a third pressure 158 created within the third sealed sub-cavity 152 to be applied via the flexible membrane 122 to the third laminate assembly stack 110. Further, the vacuum port 128 may be connected to a vacuum source for concurrently applying a vacuum 132 to the laminate assembly stacks (106, 108, 110), said stacks being positioned within the sealed cavity 126 formed by the base portion 102 and the flexible membrane 122 for promoting intimate contact between the substrates (112, 114). Alternatively, (as shown in FIG. 5) the first, second, and third pressures (154, 156, 158) may be applied by the flexible membrane 122 to a single laminate assembly stack 106. As previously described, the first, second, and third pressures may be different magnitudes/values from each other, may be the same magnitude/value, may be applied for varying durations, at varying intensities, may be applied in a uniform manner, or the like.

Figure 6:
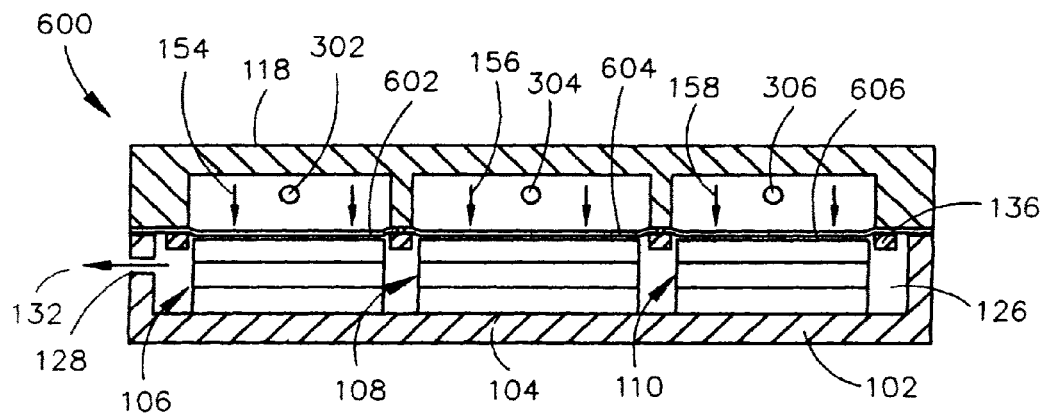
FIG. 6 is a cross-sectional view of an apparatus for performing rigid-to-rigid substrate lamination processes implementing pressure-sensitive adhesive (PSA), said apparatus implementing multiple flexible membranes for applying pressure(s) to multiple, discreet (no shared layers between stacks) laminate assembly stacks in accordance with an exemplary embodiment of the present invention.
Figure 7:
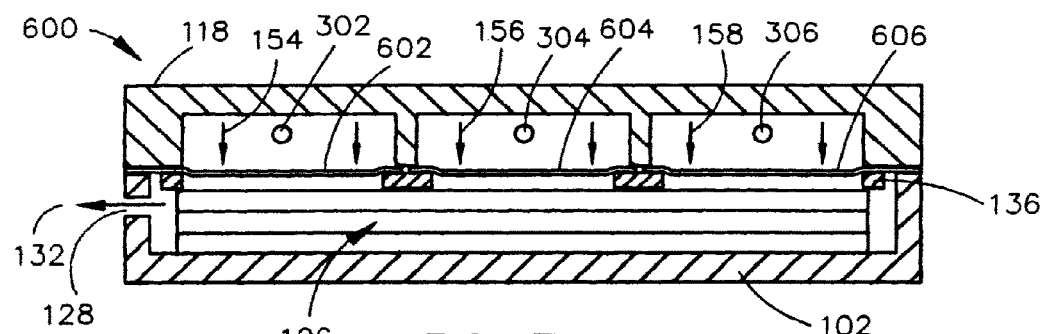
FIG. 7 is a cross-sectional view of the apparatus shown in FIG. 6, said apparatus applying pressure(s) to a single laminate assembly stack in accordance with an exemplary embodiment of the present invention.

FIGS. 6 and 7 illustrate a further alternative embodiment of an apparatus for performing rigid-to-rigid substrate lamination processes implementing pressure-sensitive adhesive (PSA) in which the apparatus 600 includes multiple flexible membranes (602, 604, 606) for applying a first pressure 154, a second pressure 156, and a third pressure 158 to one or more laminate assembly stacks (106, 108, 110), while concurrently applying a vacuum 132 to the one or more stacks. For instance, as shown in FIG. 6, a first flexible membrane 602 applies the first pressure 154 to a first stack 106, a second flexible membrane 604 applies the second pressure 156 to a second stack 108, and a third flexible membrane 606 applies the third pressure 158 to a third stack 110. Alternatively, in FIG. 7, the first, second and third flexible membranes (602, 604, 606) apply the first, second and third pressures (154, 156, 158) respectively, to a single laminate assembly stack 106 (such as when laminating larger substrates for providing a larger display assembly).

Figure 8:
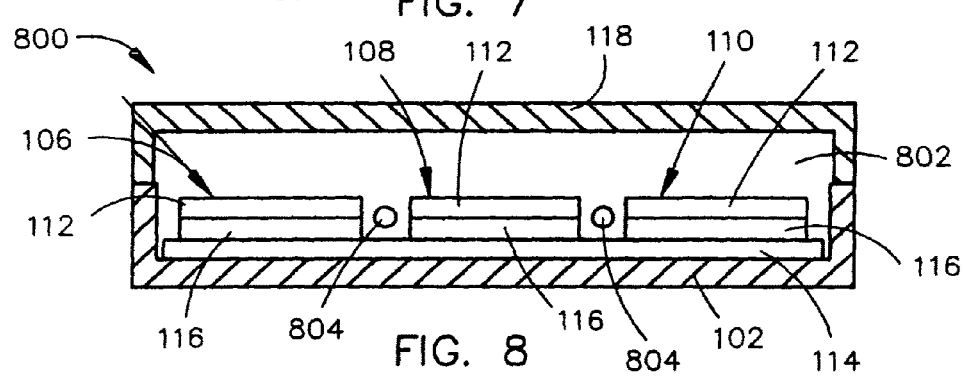
FIG. 8 is a cross-sectional view of an apparatus for performing rigid-to-rigid substrate lamination processes implementing pressure-sensitive adhesive (PSA), said apparatus not implementing flexible membrane-applied pressure, but rather relying at least substantially on substrate weight and gas evacuation for applying pressure and for providing intimate substrate contact during said lamination processes in accordance with an exemplary embodiment of the present invention.

FIG. 8 illustrates a further alternative embodiment of an apparatus for performing rigid-to-rigid substrate lamination processes implementing pressure-sensitive adhesive (PSA) in which the laminate assembly stacks (106, 108, 110) are supported on the support surface 104 of the apparatus 800. Further, the base portion 102 and the cover portion 118 form a sealed enclosure 802 when the apparatus 800 is in the closed position. The apparatus 800 includes one or more vacuum ports 804 configured for connection to vacuum source(s) for applying a vacuum to/creating a vacuum within the sealed enclosure 802. In the illustrated embodiment, the apparatus 800 relies on the weight of the substrates 112 rather than flexible membrane-applied pressure to create the force for creating intimate substrate contact. Said vacuum may also be concurrently applied to promote intimate substrate contact. Said apparatus 800 may be suitable for lamination of heavier/larger display device substrates (112, 114).

Figure 9A:
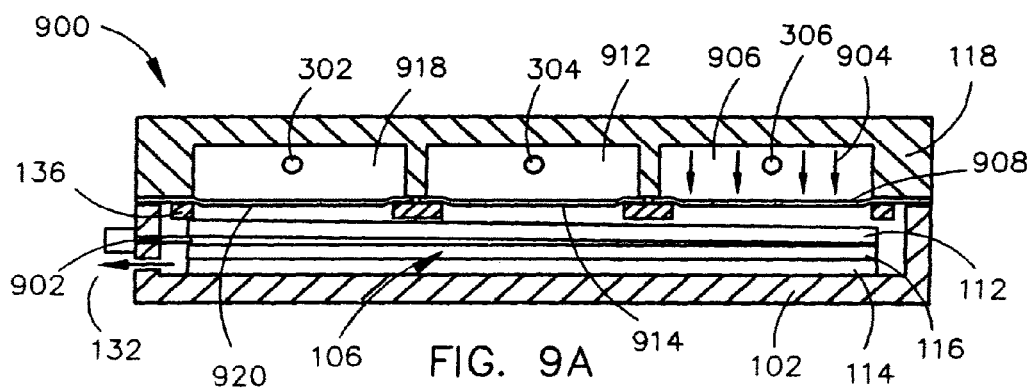
FIGS. 9A and 9B are cross-sectional views of an apparatus for performing rigid-to-rigid substrate lamination processes implementing pressure-sensitive adhesive (PSA), said apparatus including retractable pins, rods or the like for selectively providing separation between substrates/layers (FIG. 9A) and non-separation between substrates/layers (ex—pins are retracted, as in FIG. 9B) in accordance with an exemplary embodiment of the present invention.
Figure 9B:
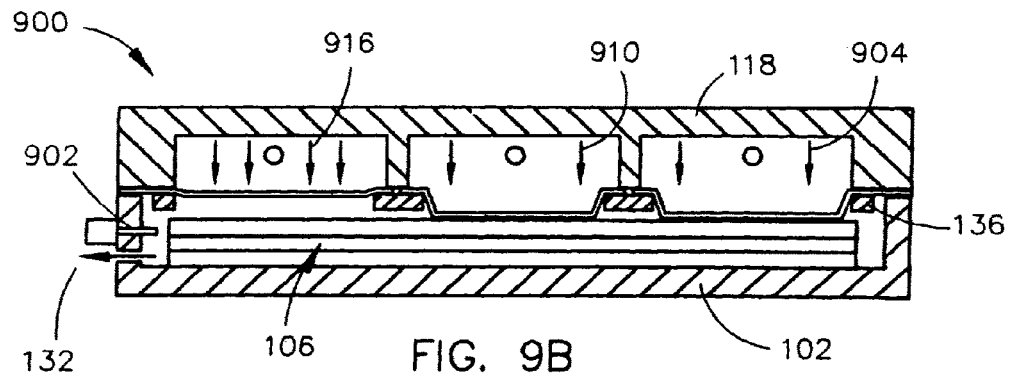
Figure 10:
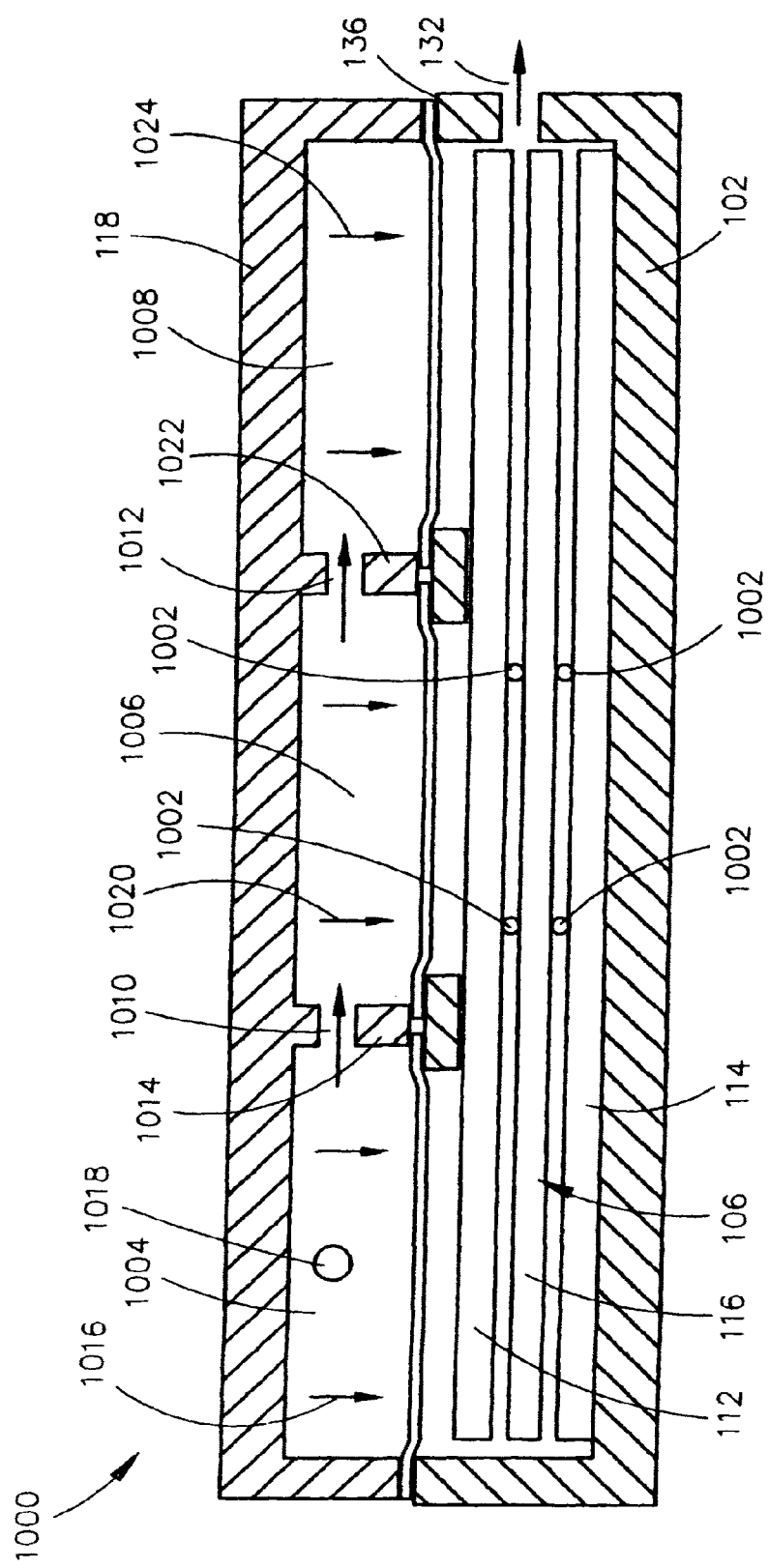
FIG. 10 is a cross-sectional view of an apparatus for performing rigid-to-rigid substrate lamination processes implementing pressure-sensitive adhesive (PSA), said apparatus including retractable pins for providing selective separation between substrates/layers, said apparatus further including equalization ports for allowing selective pressure establishment (ex—via slow leak) within the sealed sub-cavities in accordance with an exemplary embodiment of the present invention.

In further embodiments of the present invention, as shown in FIG. 9A, FIG. 9B, and FIG. 10, the apparatus (900, 1000) may be configured for allowing the substrates/layers (112, 114, 116) to contact each other in a gradual manner. In exemplary embodiments, the apparatus may be configured with a separating mechanism, such as one or more retractable pins, rods or the like (902, 1002) for maintaining spacing or separation between the substrates/layers (112, 114, 116). For instance, prior to application of pressure, such as via a flexible membrane 122, one or more of the substrates/layers 112, 114, 116 positioned within the apparatus (900, 1000) may be separated by the retractable pins (902, 1002). For example, one or more of the substrates/layers (112, 114, 116) may be completely separated from another of the substrates/layers (112, 114, 116), as shown in FIG. 10. Alternatively, one or more of the substrates/layers (112, 114, 116) may be only partially separated from another of the substrates/layers (112, 114, 116), as shown in FIG. 9A. In further embodiments, said pins (902, 1002) may be gradually/selectively retracted for allowing the substrates/layers (112, 114, 116) to come into contact/come into further (ex—greater surface area) contact with one another. During such separation and/or during such time as the substrates/layers (112, 114, 116) come into contact/come into further contact with one another, a vacuum may be applied for promoting prevention of gas entrapment between substrates and allowing intimate substrate contact. Further, during such time as the substrates/layers (112, 114, 116) come into contact/come into further contact with one another, pressure(s) may be applied for promoting intimate substrate (112, 114) contact and gas bubble-free adhesion/lamination via the PSA 116. Further, the pressure(s) may be applied sequentially and/or at different regions/locations along a surface of the first/top substrate 112, or gradually (such as via a pressure wave or gradient along/across/over a surface of the first/top substrate 112), the pressure wave allowing for a gradual squeezing together of substrates, such as in a wave-like manner, for providing intimate substrate (112, 114) contact via the PSA 116.

For instance, FIG. 9A illustrates partial separation between the first/top substrate 112 and the PSA layer 116 as maintained by the retractable pin. Further, pressure may be applied gradually/in a wave-like manner (ex—via a pressure gradient) to the laminate assembly stack 106. For example, a first pressure 904 created within a first sealed sub-cavity 906 may initially be applied to the laminate assembly stack 106 via a first flexible membrane 908 (either during initial separation, as shown in FIG. 9A, or after retraction of the pins 902. Further, a second pressure 910 created within a second sealed sub-cavity 912 may then be applied to the laminate assembly stack 106 via a second flexible membrane 914, as shown in FIG. 9B. For instance, the second pressure 910 may be the same magnitude or a different magnitude/value/amount than the first pressure 904 and may be applied in conjunction with/concurrently with the first pressure 904 (as shown in FIG. 9B) and after refraction of the pins 902, (also shown in FIG. 9B). Still further, a third pressure 916 created within a third sealed sub-cavity 918 may then be applied to the laminate assembly stack 106 via a third flexible membrane 920. (see FIG. 9B). For example, the third pressure 916 may be applied in conjunction with/concurrently with the first pressure 904 and/or second pressure 910 (as shown in FIG. 9B) and after refraction of the pins 902 (also shown in FIG. 9B). Such sequential application of pressure, such as in the gradually increasing wave-like gradient shown in FIGS. 9A & 9B, in conjunction with the applied vacuum 132 may promote intimate (ex—bubble-free) contact between substrates/layers (112, 114, 116). It is contemplated by the present invention that the pressures (904, 910, 916) may be selectably applied in various combinations (ex—one at a time or in combination), at various magnitudes, points in time, and for varying durations along various portions/at various locations along a surface (top substrate 112) of the laminated substrate assembly 106

In FIG. 10, the cover portion 118 of the apparatus is partitioned into a plurality of sealed sub-cavities (1004, 1006, 1008). The cover portion 118 is further configured with one or more equalizing ports (1010, 1012). Each equalizing port (1010, 1012) may be configured to allow for selective establishment of pressure equalization and/or variation between the sealed sub-cavities (1004, 1006, 1008). For example, a first equalizing port 1010 (ex—a one-way valve) may be configured through a first wall 1014, said first wall 1014 physically separating a first sealed sub-cavity 1004 and the second sealed sub-cavity 1006. Further, the first equalizing port 1010 may be selectively actuated (ex—opened) to allow a first pressure 1016 created within the first sealed sub-cavity 1004 (via a pressurization port 1018 configured through the cover portion 118) to be at least partially released or bled into a second sealed sub-cavity 1006 for creating a second pressure 1020 within the second sealed sub-cavity 1006. Once the second pressure 1020 is established at a desired level/magnitude, the first equalizing port 1010 may be further actuated (ex—closed) to prevent further pressure release from the first sealed sub-cavity 1004 to the second sealed sub-cavity 1006. Still further, a second equalizing port 1012 may be established through a second wall 1022, said second wall 1022 physically separating the second sealed sub-cavity 1006 and a third sealed sub-cavity 1008. Further, the second equalizing port 1012 may be selectively actuated to allow the second pressure 1020 to be at least partially released or bled into the third sealed sub-cavity 1008 for creating a third pressure 1024 within the third sealed sub-cavity 1008. Once the third pressure 1024 is established at a desire level/magnitude, the second equalization port 1012 may be further actuated to prevent further pressure release from the second sealed sub-cavity 1006 to the third sealed sub-cavity 1008. The equalizing ports 1010, 1012 may be implemented for providing a slow leak effect, which allows for multiple and/or varying pressures to be applied (such as via the flexible membranes 122) to a laminate assembly stack 106 in a localized and/or sequential and/or gradient like manner without having to connect the apparatus 1000 with multiple pressure sources. Further, a vacuum 132 may be applied to said laminate assembly stack 106 for promoting intimate substrate (112, 114) contact via the PSA 116. In further embodiments, a single, continuous, flexible membrane 122 (as shown in FIG. 11) rather than multiple flexible membranes (908, 914, 920) may be implemented with the embodiments of the apparatus (900, 1000) shown in FIGS. 9A, 9B and 10.

Figure 11:
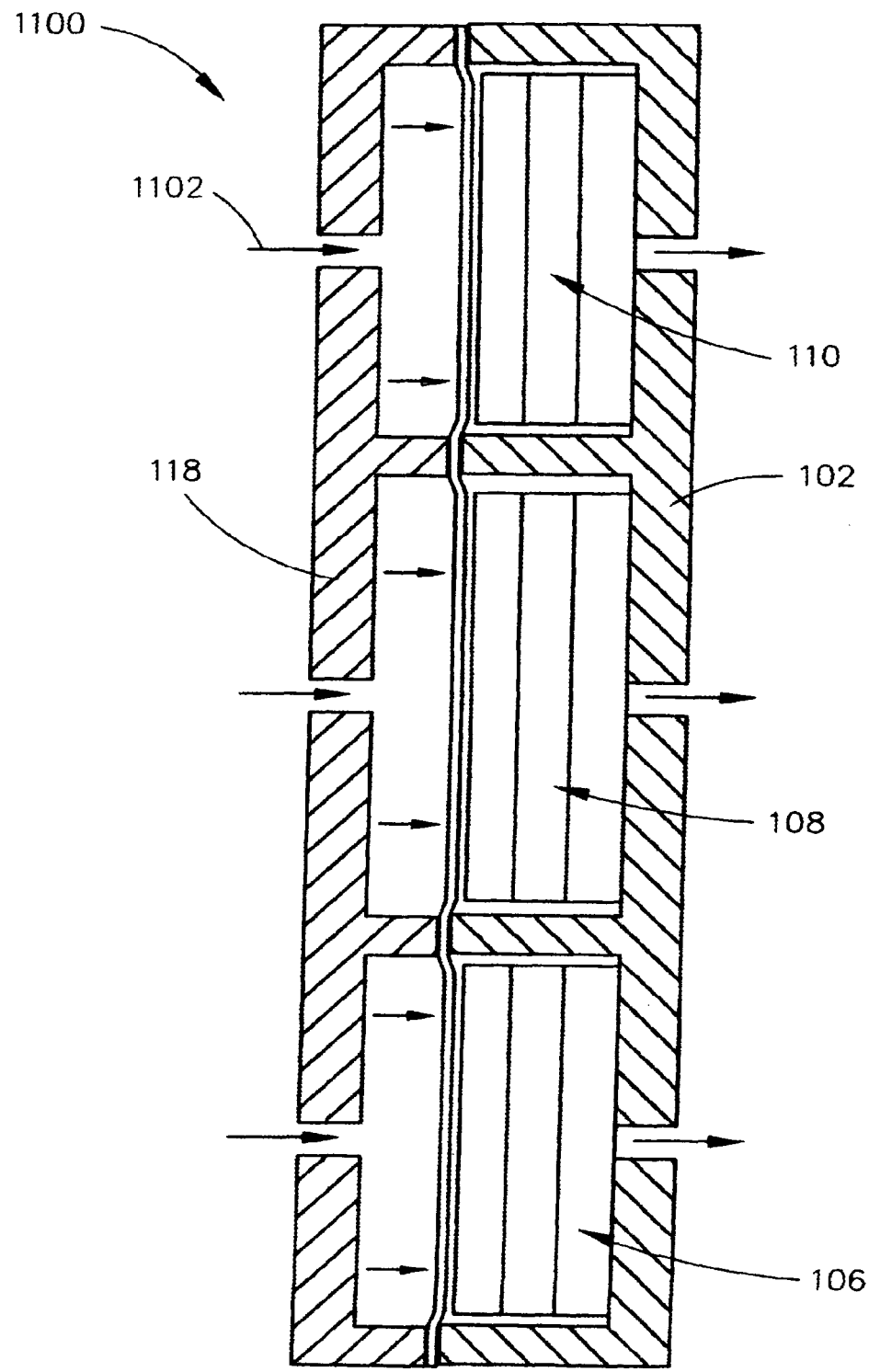
FIG. 11 illustrates a cross-sectional view of an apparatus for performing rigid-to-rigid substrate lamination processes implementing pressure-sensitive adhesive (PSA), said apparatus being oriented such that pressure(s) is/are applied along a horizontal plane/axis to multiple laminate assembly stacks in accordance with an exemplary embodiment of the present invention.

In further embodiments, such as in FIG. 11, an apparatus 1100 for performing rigid-to-rigid substrate lamination processes implementing pressure-sensitive adhesive (PSA) is shown, said apparatus 1100 may be oriented along a vertical axis, such that pressure 1102 may be applied along a horizontal axis to laminate assembly stacks (106, 108, 110).

Figure 12:
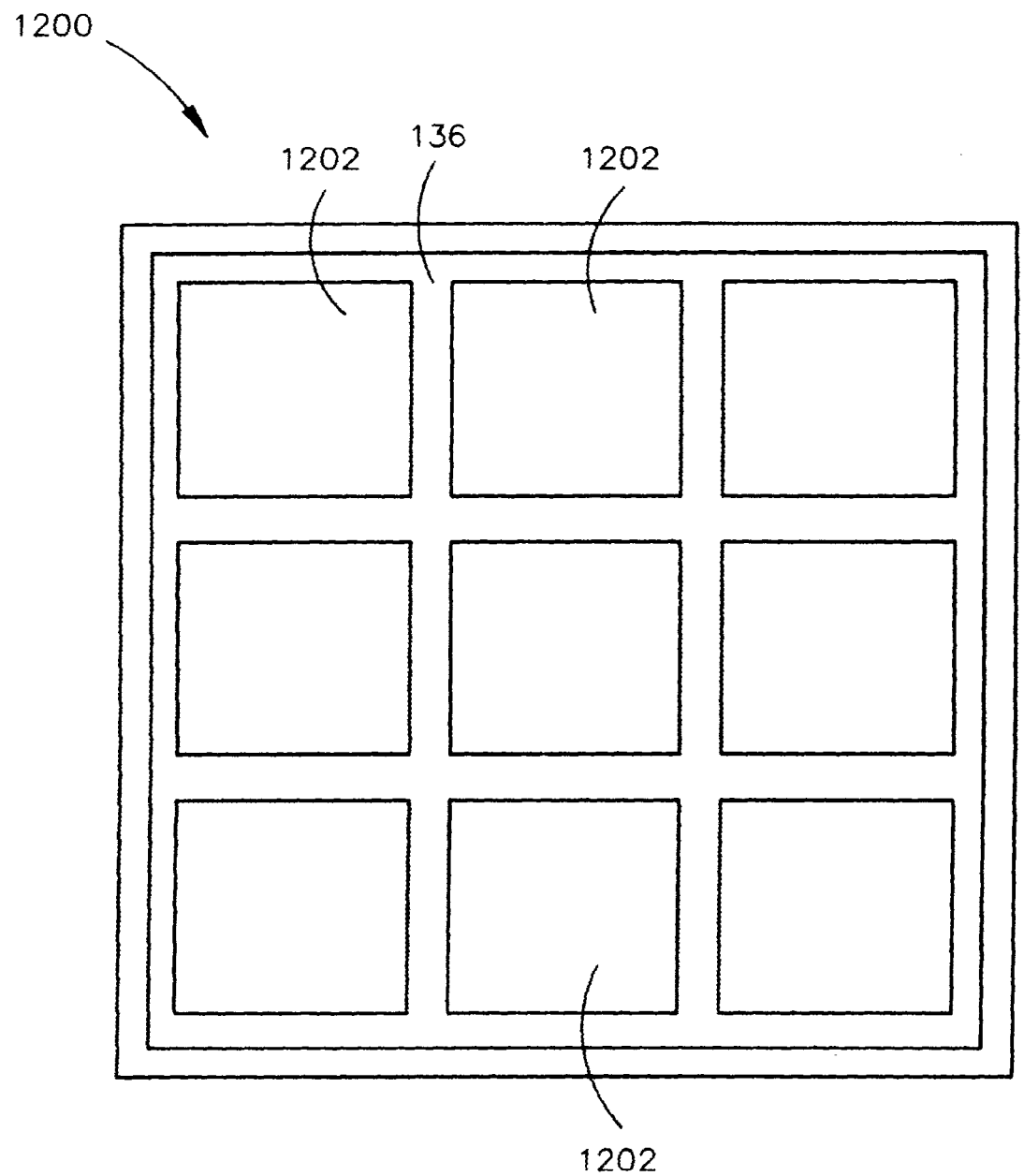
FIG. 12 illustrates a top view of an apparatus for performing rigid-to-rigid substrate lamination processes implementing pressure-sensitive adhesive (PSA), said apparatus including a plurality of sealed sub-cavities/pressure zones in accordance with an exemplary embodiment of the present invention.

In additional embodiments, as in FIG. 12, a top view of an apparatus 1200 for performing rigid-to-rigid substrate lamination processes implementing pressure-sensitive adhesive (PSA) is shown as having a plurality of sealed sub-cavities or pressure zones 1202 in which varying pressures may be created and applied, such as via flexible membranes 122 at various locations on/along substrate surfaces of one or more laminate substrate assemblies (106, 108, 110).

Figure 13:
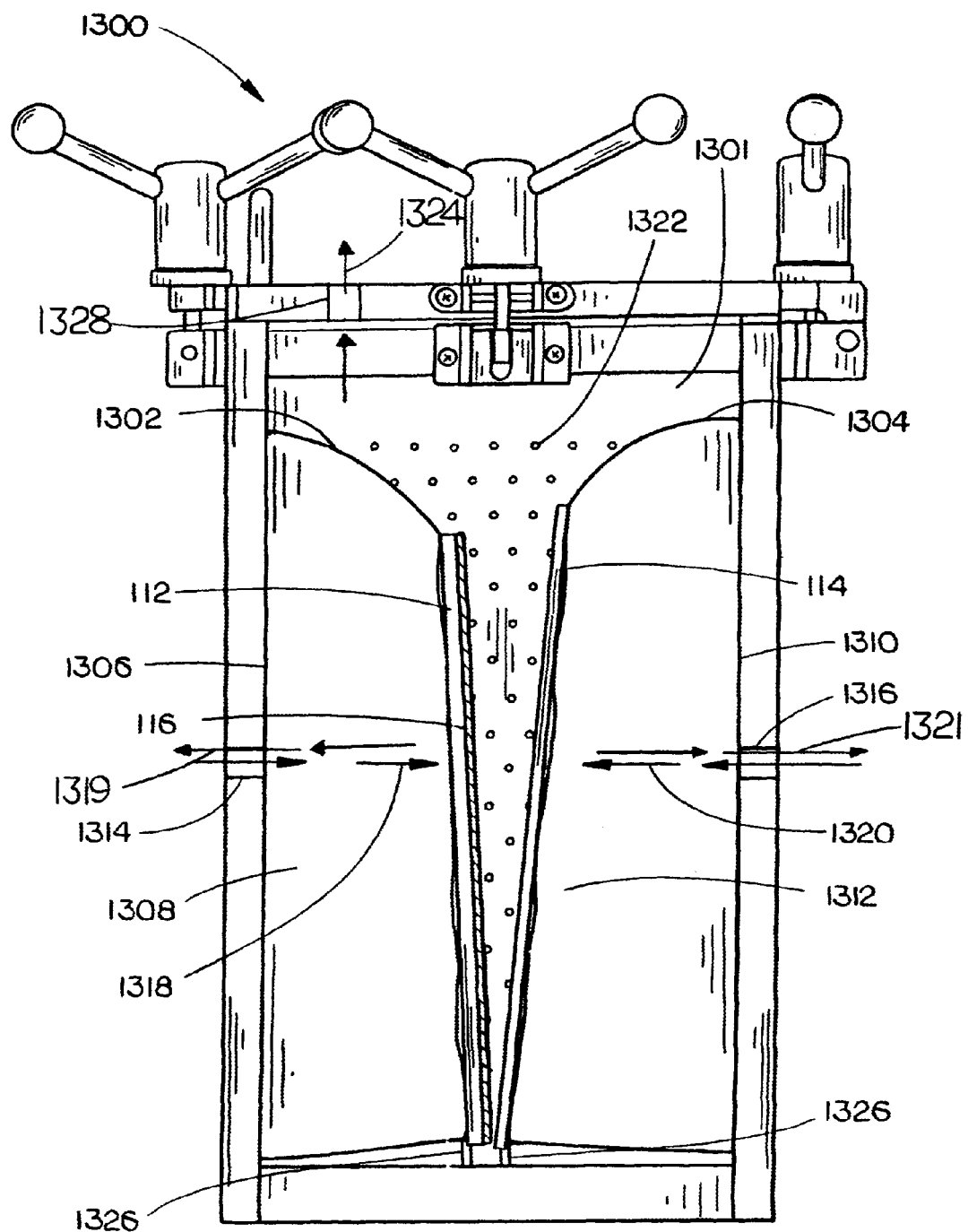
FIG. 13 illustrates a cross-sectional view of an apparatus for performing rigid-to-rigid substrate lamination processes implementing pressure-sensitive adhesive (PSA), said apparatus being oriented such that pressures are applied in opposing directions against a laminate assembly stack via dual flexible membranes in accordance with an exemplary embodiment of the present invention.

In an alternative embodiment, as shown in FIG. 13, an apparatus 1300 for performing rigid-to-rigid substrate lamination processes implementing pressure-sensitive adhesive (PSA) is shown, said apparatus 1300 may be oriented along a vertical axis (as in FIG. 11) and may be similar to that shown in FIG. 8 of United States patent application entitled: "Alignment System and Method Thereof" filed Jan. 18, 2008 and having Express Mail Mailing Label Number EM 117518667 US, which is herein incorporated by reference in its entirety. The apparatus 1300 may form a sealed enclosure 1301 and may include a first flexible membrane 1302 and a second flexible membrane 1304. The first flexible membrane 1302 and a first interior surface 1306 of the apparatus 1300 may be connected so as to form a first sealed cavity 1308. The second flexible membrane 1304 and a second interior surface 1310 of the apparatus 1300 may be connected so as to form a second sealed cavity 1312.

Further, the apparatus 1300 may be configured with a first pressurization port 1314, said first pressurization/vacuum port 1314 configured for being connected to a pressurization source for pressurizing the first sealed cavity 1308, said first pressurization/vacuum port 1314 further configured for being connected to a vacuum pump for creating a vacuum within the first sealed cavity 1308. The apparatus 1300 may also be configured with a second pressurization/vacuum port 1316, said second pressurization/vacuum port 1316 configured for being connected to a pressurization source for pressurizing the second sealed cavity 1312, said second pressurization/vacuum port 1316 further configured for being connected to a vacuum pump for creating a vacuum within the second sealed cavity 1312. A first pressure 1318 may be created within the first sealed cavity 1308 via the first pressurization/vacuum port 1314. Further, a second pressure 1320 may be created within the second sealed cavity 1312 via the second pressurization/vacuum port 1316. The first pressure 1318 may be applied via the first flexible membrane 1302 against a laminate assembly stack 106 which is positioned within the apparatus 1300. The second pressure 1320 may also be applied via the second flexible membrane 1304 against the laminate assembly stack 106. In additional embodiments, prior to creating the first pressure 1318 within the first sealed cavity 1308 and prior to creating the second pressure 1320 within the second sealed cavity 1312, a first vacuum 1319 may be created within the first sealed cavity 1308 via the first pressurization/vacuum port 1314 and a second vacuum 1321 may be created within the second sealed cavity 1312 via the second pressurization/vacuum port 1316. Creating said vacuums 1319, 1321 prior to creating said pressures 1318, 1320 may be done to prevent stress or damage to the first and second flexible membranes 1302, 1304.

As shown in FIG. 13, the first pressure 1318 may be applied in a first direction along a horizontal axis and the second pressure 1320 may be applied in a second direction along a horizontal axis, the second direction being a generally opposite direction from the first direction. Applying pressure to the laminate assembly stack 106 in such a manner causes the laminate assembly stack 106 to be squeezed between the flexible membranes (1302, 1304) for promoting intimate substrate (112, 114) contact via the PSA (116) for the laminate assembly stack 106. Further, the apparatus 1300 may be configured with one or more vacuum ports 1328 via which a vacuum 1324 may be created within the apparatus 1300. Said vacuum 1324 may be concurrently applied to said laminate assembly stack for promoting intimate substrate contact. The first pressure 1318 and the second pressure 1320 may be the same or different magnitudes, may be applied for the same or varying durations, may be applied in a ramped or uniform manner, as a pressure gradient, in such a manner as to gradually cause substrates/layers (112, 114, 116) to come into contact, such as when standoffs/pegs/retractable pins 1326 are implemented, or in any variations as described in the embodiments herein. For instance, the apparatus 1300 may be configured with one or more of a plurality of positioning ports 1322, said positioning ports 1322 being configured for receiving one or more of the retractable pins/pegs 1326 to allow said pins/pegs 1326 to be selectively positioned for supporting/separating the substrates/layers (112, 114, 116). Further, said positioning ports 1322 may be threaded for receiving correspondingly threaded pins/pegs 1326.

Figure 14:
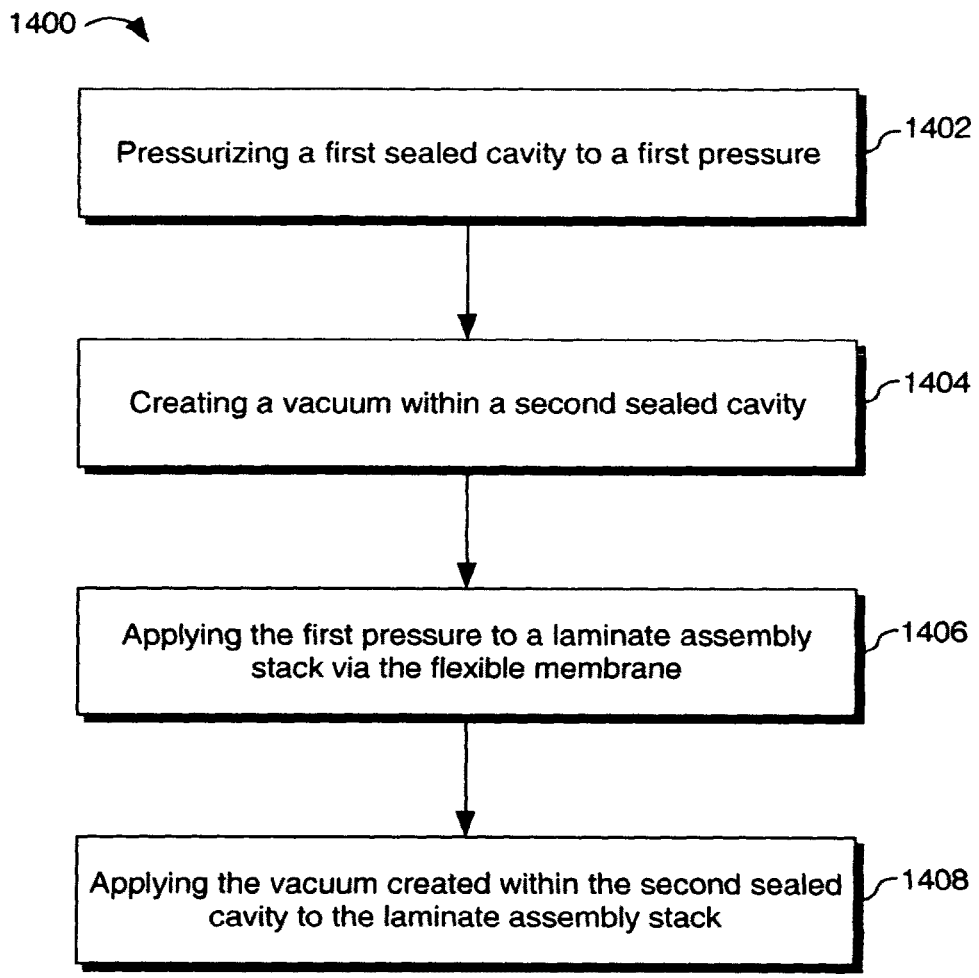
FIG. 14 is a flowchart illustrating a process for performing rigid-to-rigid substrate lamination implementing pressure-sensitive adhesive (PSA) in accordance with an exemplary embodiment of the present invention.

Referring generally to FIGS. 14-18, process for performing rigid-to-rigid substrate lamination implementing pressure-sensitive adhesive (PSA) are shown in accordance with exemplary embodiments of the present invention. In FIG. 14, a process 1400 for performing rigid-to-rigid substrate lamination implementing pressure-sensitive adhesive (PSA) may include the steps of: pressurizing a first sealed cavity to a first pressure 1402; creating a vacuum within a second sealed cavity, the second sealed cavity being sealed from the first sealed cavity by a flexible membrane 1404; applying the first pressure to a laminate assembly stack via the flexible membrane, the laminate assembly stack including a first substrate, a second substrate, and a PSA layer, the PSA layer being positioned between the first substrate and the second substrate 1406; and applying the vacuum created within the second sealed cavity to the laminate assembly stack 1408. The applied first pressure and the applied vacuum promote intimate contact between the first substrate and the second substrate of the laminate assembly stack via the PSA layer.

Figure 15:
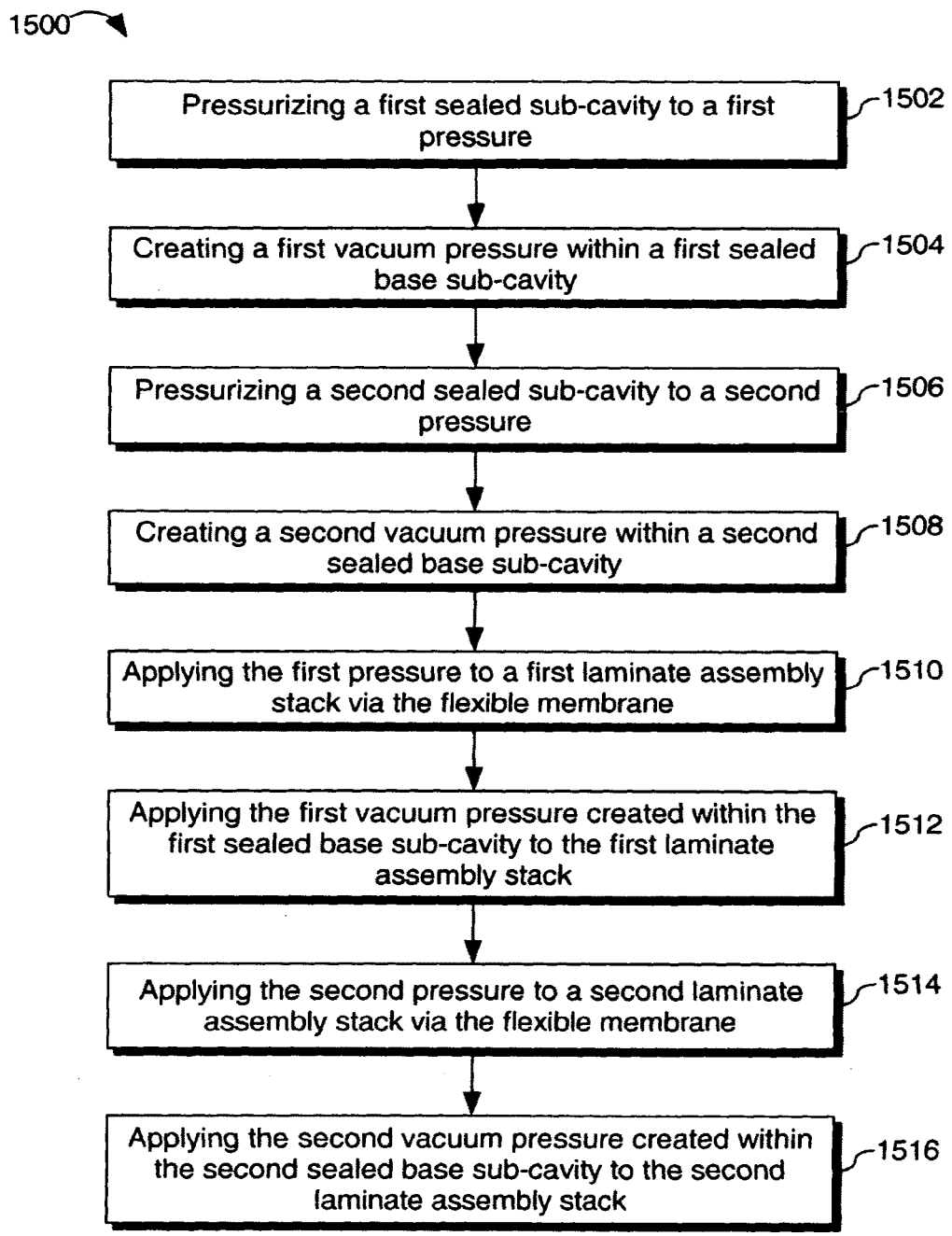
FIG. 15 is a flowchart illustrating a process for performing rigid-to-rigid substrate lamination implementing pressure-sensitive adhesive (PSA) in accordance with an exemplary embodiment of the present invention.

In FIG. 15, a process 1500 for performing rigid-to-rigid substrate lamination implementing pressure-sensitive adhesive (PSA) is shown which may include the steps of: pressurizing a first sealed sub-cavity to a first pressure 1502; creating a first vacuum pressure within a first sealed base sub-cavity, the first sealed base sub-cavity being sealed from the first sealed sub-cavity by a flexible membrane 1504; pressurizing a second sealed sub-cavity to a second pressure 1506; creating a second vacuum pressure within a second sealed base sub-cavity, the second sealed base sub-cavity being sealed from the second sealed sub-cavity by the flexible membrane 1508; applying the first pressure to a first laminate assembly stack via the flexible membrane, the first laminate assembly stack including a first substrate, a second substrate, and a PSA layer, the PSA layer being positioned between the first substrate and the second substrate 1510; applying the first vacuum pressure created within the first sealed base sub-cavity to the first laminate assembly stack 1512; applying the second pressure to a second laminate assembly stack via the flexible membrane, the second laminate assembly stack including a first substrate, a second substrate, and a PSA layer, the PSA layer being positioned between the first substrate and the second substrate 1514; and applying the second vacuum pressure created within the second sealed base sub-cavity to the second laminate assembly stack 1516. The applied first pressure and the applied first vacuum pressure promote intimate contact between the first substrate and the second substrate of the first laminate assembly stack via the PSA layer of the first laminate assembly stack, wherein the applied second pressure and the applied second vacuum pressure promote intimate contact between the first substrate and the second substrate of the second laminate assembly stack via the PSA layer of the second laminate assembly stack.

Figure 16:
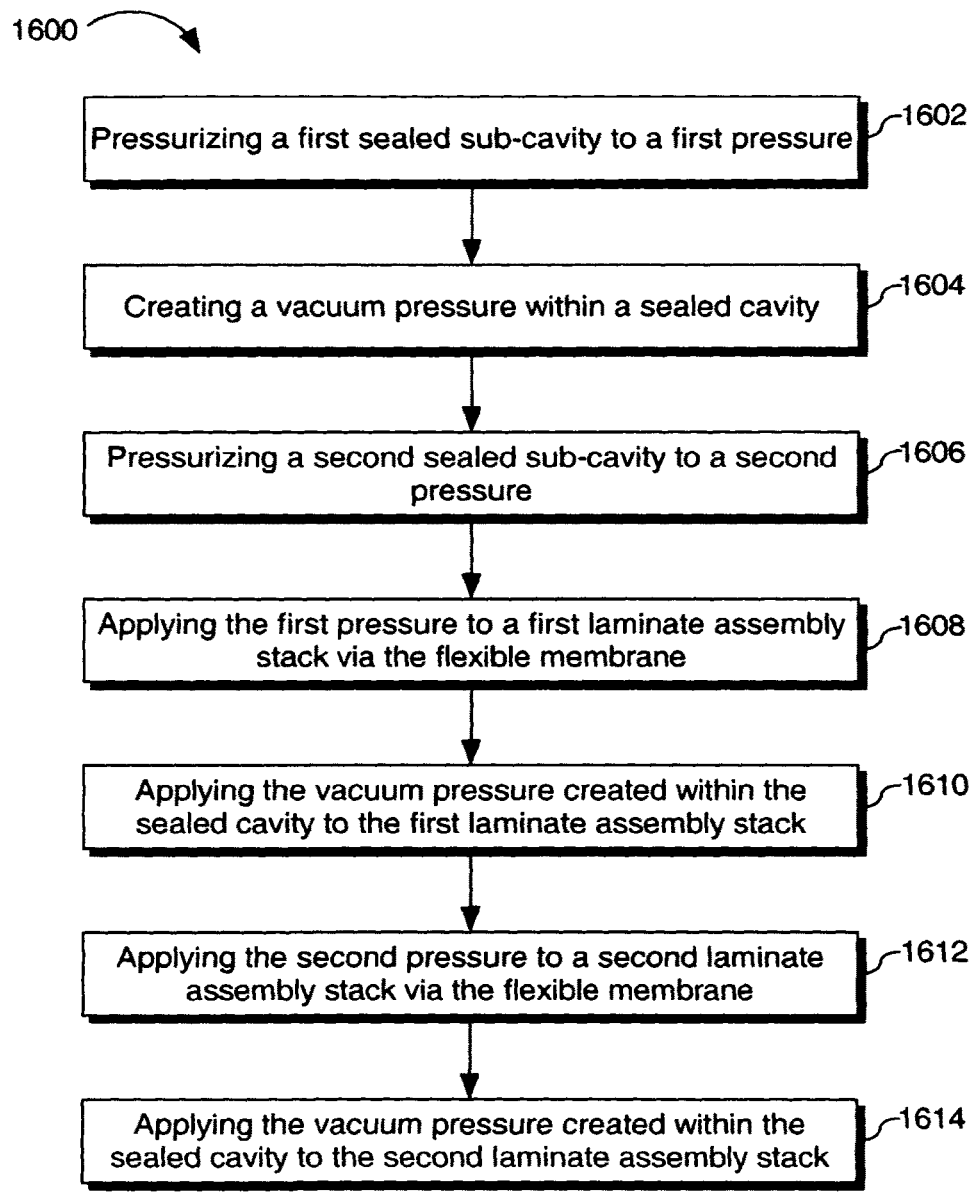
FIG. 16 is a flowchart illustrating a process for performing rigid-to-rigid substrate lamination implementing pressure-sensitive adhesive (PSA) in accordance with an exemplary embodiment of the present invention.

In FIG. 16, a process 1600 for performing rigid-to-rigid substrate lamination implementing pressure-sensitive adhesive (PSA) is shown which may include the steps of: pressurizing a first sealed sub-cavity to a first pressure 1602; creating a vacuum pressure within a sealed cavity, the sealed cavity being sealed from the first sealed sub-cavity by a flexible membrane 1604; pressurizing a second sealed sub-cavity to a second pressure, the second sealed sub-cavity being sealed from the sealed cavity by the flexible membrane 1606; applying the first pressure to a first laminate assembly stack via the flexible membrane, the first laminate assembly stack including a first substrate, a second substrate, and a PSA layer, the PSA layer being positioned between the first substrate and the second substrate 1608; applying the vacuum pressure created within the sealed cavity to the first laminate assembly stack 1610; applying the second pressure to a second laminate assembly stack via the flexible membrane, the second laminate assembly stack including a first substrate, a second substrate, and a PSA layer, the PSA layer being positioned between the first substrate and the second substrate 1612; and applying the vacuum pressure created within the sealed cavity to the second laminate assembly stack 1614. The applied first pressure and the applied vacuum pressure promote intimate contact between the first substrate and the second substrate of the first laminate assembly stack via the PSA layer of the first laminate assembly stack, wherein the applied second pressure and the applied vacuum pressure promote intimate contact between the first substrate and the second substrate of the second laminate assembly stack via the PSA layer of the second laminate assembly stack.

Figure 17:
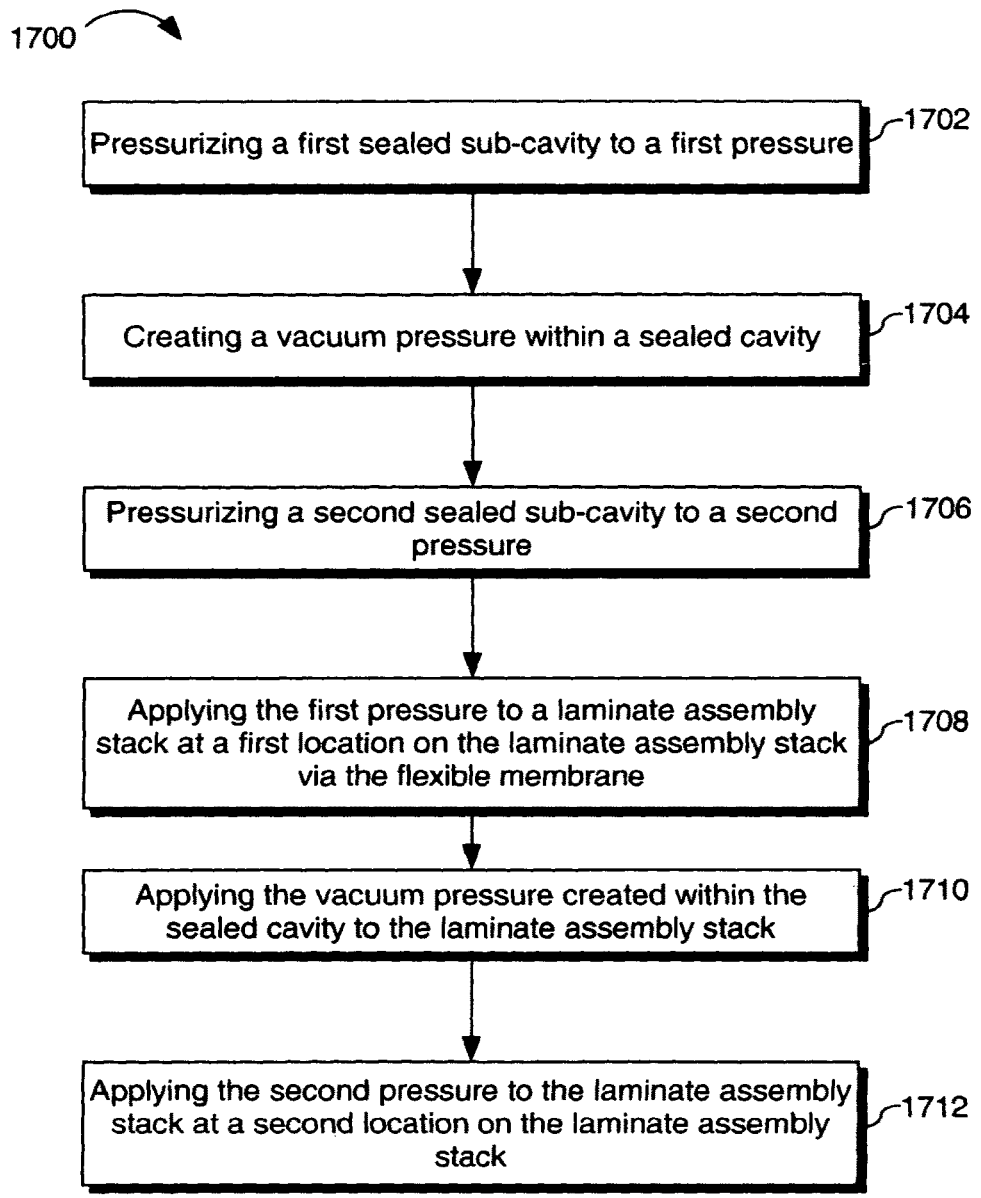
FIG. 17 is a flowchart illustrating a process for performing rigid-to-rigid substrate lamination implementing pressure-sensitive adhesive (PSA) in accordance with an exemplary embodiment of the present invention.

In FIG. 17, a process 1700 for performing rigid-to-rigid substrate lamination implementing pressure-sensitive adhesive (PSA) is shown which may include the steps of: pressurizing a first sealed sub-cavity to a first pressure 1702; creating a vacuum pressure within a sealed cavity, the sealed cavity being sealed from the first sealed sub-cavity by a flexible membrane 1704; pressurizing a second sealed sub-cavity to a second pressure, the second sealed sub-cavity being sealed from the sealed cavity by the flexible membrane 1706; applying the first pressure to a laminate assembly stack at a first location on the laminate assembly stack via the flexible membrane, the laminate assembly stack including a first substrate, a second substrate, and a PSA layer, the PSA layer being positioned between the first substrate and the second substrate 1708; applying the vacuum pressure created within the sealed cavity to the laminate assembly stack 1710; and applying the second pressure to the laminate assembly stack at a second location on the laminate assembly stack via the flexible membrane, the second location being different than the first location 1712. The applied first pressure, the applied second pressure, and the applied vacuum pressure promote intimate contact between the first substrate and the second substrate of the laminate assembly stack via the PSA layer of the laminate assembly stack.

Figure 18:
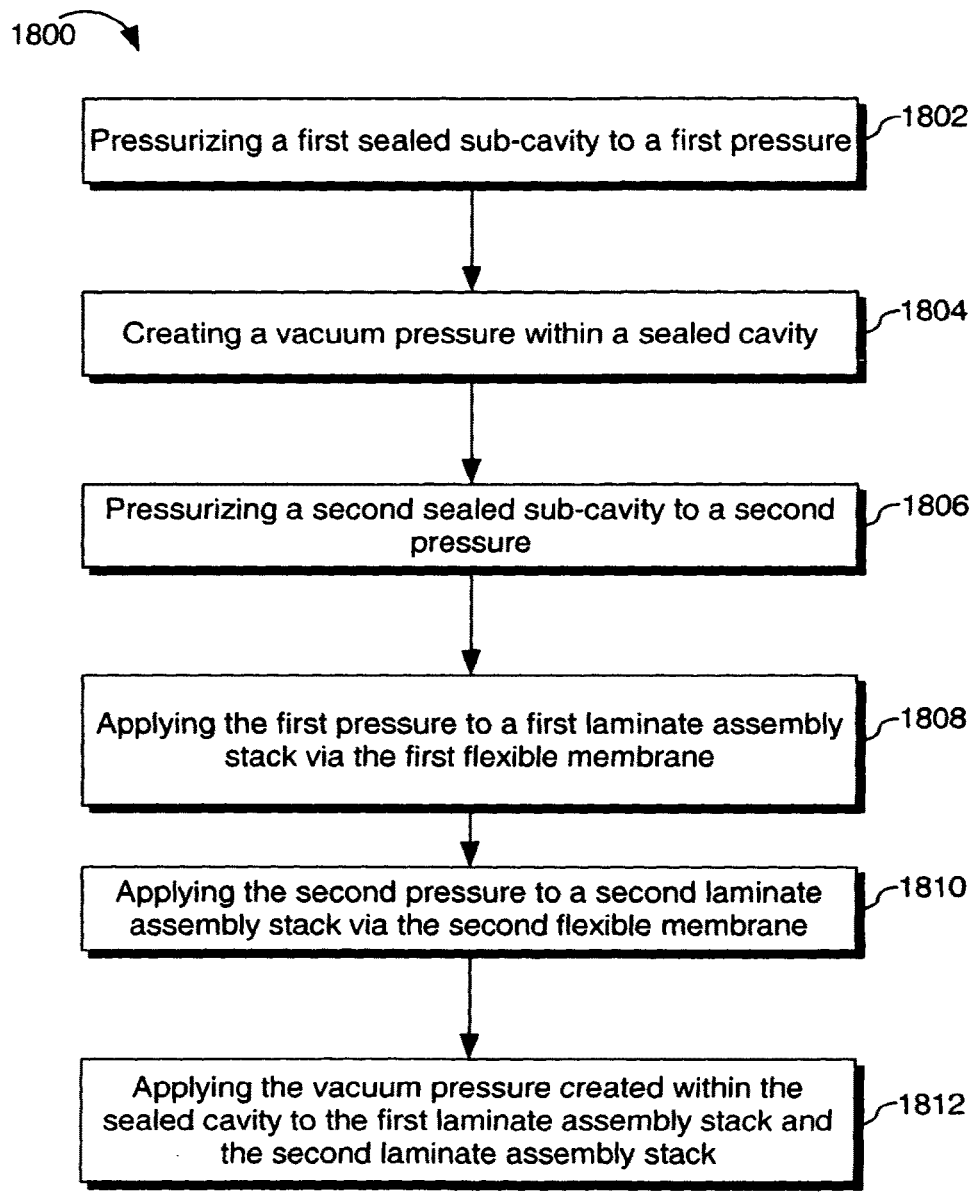
FIG. 18 is a flowchart illustrating a process for performing rigid-to-rigid substrate lamination implementing pressure-sensitive adhesive (PSA) in accordance with an exemplary embodiment of the present invention.

In FIG. 18, a process 1800 for performing rigid-to-rigid substrate lamination implementing pressure-sensitive adhesive (PSA) is shown which may include the steps of: pressurizing a first sealed sub-cavity to a first pressure 1802; creating a vacuum pressure within a sealed cavity, the sealed cavity being sealed from the first sealed sub-cavity by a first flexible membrane 1804; pressurizing a second sealed sub-cavity to a second pressure, the second sealed sub-cavity being sealed from the sealed cavity by a second flexible membrane 1806; applying the first pressure to a first laminate assembly stack via the first flexible membrane, the first laminate assembly stack including a first substrate, a second substrate, and a PSA layer, the PSA layer being positioned between the first substrate and the second substrate 1808; applying the second pressure to a second laminate assembly stack via the second flexible membrane, the second laminate assembly stack including a first substrate, a second substrate, and a PSA layer, the PSA layer being positioned between the first substrate and the second substrate 1810; and applying the vacuum pressure created within the sealed cavity to the first laminate assembly stack and the second laminate assembly stack 1812. The applied first pressure and the applied vacuum pressure promote intimate contact between the first substrate and the second substrate of the first laminate assembly stack via the PSA layer of the first laminate assembly stack, wherein the applied second pressure and the applied vacuum pressure promote intimate contact between the first substrate and the second substrate of the second laminate assembly stack via the PSA layer of the second laminate assembly stack.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus for performing rigid-to-rigid substrate lamination processes implementing pressure-sensitive adhesive (PSA), comprising:
    a base portion, the base portion being configured with a support surface for supporting at least one laminate assembly stack, each laminate assembly stack included in the at least one laminate assembly stack including at least one layer of PSA, a first substrate, and a second substrate, the at least one layer of PSA being positioned between the first substrate and the second substrate, the base portion being further configured with a vacuum port for allowing the base portion to be connected with a vacuum pump;
    a cover portion configured for being connected with the base portion, the cover portion further configured for forming an enclosure with the base portion when the apparatus is established in a closed position, the cover portion being configured with at least one pressurization port for allowing the cover portion to be connected with at least one pressurization source;
    at least one flexible membrane configured for being at least one of connected to the cover portion, connected to the base portion, or positioned between the cover portion and the base portion, the at least one flexible membrane and the cover portion forming a first sealed cavity when the apparatus is established in the closed position, the at least one flexible membrane and base portion forming a second sealed cavity when the apparatus is established in the closed position, when a pressure is created within the first sealed cavity via the pressurization port and when a vacuum is created within the second sealed cavity via the vacuum port, the at least one flexible membrane further configured for applying said pressure to the at least one laminate assembly stack while said vacuum is applied to the at least one laminate assembly stack; and
    a protective carriage, the protective carriage having at least one aperture formed therethrough, the protective carriage configured for being placed upon the support surface for protecting substrate components from the pressure applied by the at least one flexible membrane, further, the support surface and the protective carriage being configured for forming a partial enclosure when the protective carriage is placed upon the support surface;
    wherein at least one of a magnitude, duration or location of the applied pressure is selectably controllable, the applied pressure and applied vacuum promoting intimate contact between the first substrate and the second substrate via the PSA layer(s) for the at least one laminate assembly stack during rigid-to-rigid substrate lamination processes.

2. The apparatus of claim 1, wherein the at least one flexible membrane is configured for applying the pressure created within the first sealed cavity to the at least one laminate assembly stack via the at least one aperture of the protective carriage.

3. The apparatus of claim 1, wherein at least one of the first substrate, the PSA layer(s) and the second substrate are shared between a first laminate assembly stack included in the at least one laminate assembly stack and a second laminate assembly stack included in the at least one laminate assembly stack.

4. An apparatus for performing rigid-to-rigid substrate lamination processes implementing pressure-sensitive adhesive (PSA), comprising:
    a base portion, the base portion being configured with a support surface for supporting at least one laminate assembly stack, each laminate assembly stack included in the at least one laminate assembly stack including at least one layer of PSA, a first substrate, and a second substrate, the at least one layer of PSA being positioned between the first substrate and the second substrate, the base portion being further configured with a vacuum port for allowing the base portion to be connected with a vacuum pump;
    a cover portion configured for being connected with the base portion, the cover portion further configured for forming an enclosure with the base portion when the apparatus is established in a closed position, the cover portion forming a first partition and a second partition, the first partition being configured with a first pressurization port for allowing the first partition of the cover portion to be connected with a first pressurization source; the second partition being configured with a second pressurization port for allowing the second partition of the cover portion to be connected with a second pressurization source; and
    a flexible membrane configured for being at least one of connected to the cover portion, connected to the base portion, or positioned between the cover portion and the base portion, the flexible membrane and the first partition of the cover portion forming a first sealed sub-cavity when the apparatus is established in the closed position, the flexible membrane and the second partition forming a second sealed sub-cavity when the apparatus is established in the closed position, the flexible membrane and base portion forming a sealed cavity when the apparatus is established in the closed position,
    wherein when a first pressure is created within the first sealed sub-cavity via the first pressurization port and when a vacuum is created within the sealed cavity via the vacuum port, the flexible membrane is further configured for applying the first pressure to the at least one laminate assembly stack while said vacuum is applied to the at least one laminate assembly stack, wherein when a second pressure is created within the second sealed sub-cavity via the second pressurization port and when the vacuum is created within the sealed cavity, the flexible membrane is further configured for applying the second pressure to the at least one laminate assembly stack, at least one of a magnitude, duration or location of the applied first pressure and the applied second pressure are selectably controllable, the applied first pressure, applied second pressure and applied vacuum promoting intimate contact between the first substrate and the second substrate of the at least one laminate assembly stack via the PSA layer(s), during rigid-to-rigid substrate lamination processes.

5. The apparatus of claim 4, further comprising:
a protective carriage, the protective carriage having a first aperture and a second aperture formed therethrough, the protective carriage configured for being placed upon the support surface for protecting substrate components from the pressure applied by the flexible membrane, further, the support surface and the protective carriage being configured for forming a partial enclosure when the protective carriage is placed upon the support surface.

6. The apparatus of claim 5, wherein the flexible membrane is configured for applying the first pressure created within the first sealed sub-cavity to the laminate assembly stack via the first aperture of the protective carriage, the flexible membrane being further configured for applying the second pressure created with the second sealed sub-cavity to the laminate assembly stack via the second aperture of the protective carriage.

7. The apparatus of claim 4, wherein at least one of the first substrate, the PSA layer(s) and the second substrate are shared between a first laminate assembly stack included in the at least one laminate assembly stack and a second laminate assembly stack included in the at least one laminate assembly stack.

8. An apparatus for performing rigid-to-rigid substrate lamination processes implementing pressure-sensitive adhesive (PSA), comprising:
a base portion, the base portion being configured with a support surface for supporting at least one laminate assembly stack, each laminate assembly stack included in the at least one laminate assembly stack including at least one layer of PSA, a first substrate, and a second substrate, the at least one layer of PSA being positioned between the first substrate and the second substrate, the base portion being further configured with a vacuum port for allowing the base portion to be connected with a vacuum pump;
a cover portion configured for being connected with the base portion, the cover portion further configured for forming an enclosure with the base portion when the apparatus is established in a closed position, the cover portion forming a first partition and a second partition, the first partition being configured with a first pressurization port for allowing the first partition of the cover portion to be connected with a first pressurization source; the second partition being configured with a second pressurization port for allowing the second partition of the cover portion to be connected with a second pressurization source; and
a first flexible membrane and a second flexible membrane, each configured for being at least one of connected to the cover portion, connected to the base portion, or positioned between the cover portion and the base portion, the first flexible membrane and the first partition of the cover portion forming a first sealed sub-cavity when the apparatus is established in the closed position, the second flexible membrane and the second partition forming a second sealed sub-cavity when the apparatus is established in the closed position, the first flexible membrane, the second flexible membrane and the base portion forming a sealed cavity when the apparatus is established in the closed position,
wherein when a first pressure is created within the first sealed sub-cavity via the first pressurization port and when a vacuum is created within the sealed cavity via the vacuum port, the first flexible membrane is further configured for applying the first pressure to the at least one laminate assembly stack while said vacuum is applied to the at least one laminate assembly stack, wherein when a second pressure is created within the second sealed sub-cavity via the second pressurization port and when the vacuum is created within the sealed cavity, the second flexible membrane is further configured for applying the second pressure to the at least one laminate assembly stack, at least one of a magnitude, duration or location of the applied first pressure and the applied second pressure are selectably controllable, the applied first pressure, applied second pressure and applied vacuum promoting intimate contact between the first substrate and the second substrate of the at least one laminate assembly stack via the PSA layer(s), during rigid-to-rigid substrate lamination processes.

9. The apparatus of claim 8, further comprising:
a protective carriage, the protective carriage having a first aperture and a second aperture formed therethrough, the protective carriage configured for being placed upon the support surface for protecting substrate components from the pressure applied by the first flexible membrane and the second flexible membrane, further, the support surface and the protective carriage being configured for forming a partial enclosure when the protective carriage is placed upon the support surface.

10. The apparatus of claim 9, wherein the first flexible membrane is configured for applying the first pressure created within the first sealed sub-cavity to the at least one laminate assembly stack via the first aperture of the protective carriage, the flexible membrane being further configured for applying the second pressure created with the second sealed sub-cavity to the at least one laminate assembly stack via the second aperture of the protective carriage.

11. The apparatus of claim 8, further comprising:
at least one retractable pin configured for maintaining separation and allowing selective substrate contact for the at least one laminate assembly stack.

* * * * *